US007412338B2

(12) United States Patent
Wynans et al.

(10) Patent No.: US 7,412,338 B2
(45) Date of Patent: Aug. 12, 2008

(54) RADIO FREQUENCY DEVICE WITHIN AN ENERGY SENSOR SYSTEM

(75) Inventors: Arthur B. Wynans, Victoria (CA); Daniel Alan Cumming, Sidney (CA); Michael E. Teachman, Victoria (CA); Eric K. Haight, Victoria (CA); Daniel N. Loewen, Sidney (CA); Martin A. Hancock, Victoria (CA); Colin N. Gunn, Victoria (CA)

(73) Assignee: Power Measurement Ltd., Saanichton, BC (CA)

( * ) Notice: Subject to any disclaimer, the term of this patent is extended or adjusted under 35 U.S.C. 154(b) by 14 days.

(21) Appl. No.: 11/083,909

(22) Filed: Mar. 18, 2005

(65) Prior Publication Data
US 2005/0206530 A1    Sep. 22, 2005

Related U.S. Application Data

(60) Provisional application No. 60/554,188, filed on Mar. 18, 2004.

(51) Int. Cl.
*G08C 17/00* (2006.01)

(52) U.S. Cl. .............................. 702/61; 702/60; 702/62; 702/122; 702/124; 702/187; 702/188; 700/22; 700/9; 700/286; 700/291; 700/293; 700/295; 700/296; 324/74; 324/113; 324/118; 324/141; 324/142

(58) Field of Classification Search ............ 702/60–61, 702/187, 188, 122, 124; 361/65; 700/22, 700/9, 286, 291, 293, 295–296; 324/74, 324/113, 118, 141–142
See application file for complete search history.

(56) References Cited

U.S. PATENT DOCUMENTS

| 3,534,247 | A | 10/1970 | Miljanic ........................ 323/48 |
| 4,841,236 | A | 6/1989 | Miljanic et al. ............. 324/127 |
| 5,563,506 | A | 10/1996 | Fielden et al. |
| 5,631,636 | A | 5/1997 | Bane ...................... 340/825.69 |
| 5,644,514 | A | 7/1997 | Abo et al. |
| 5,684,466 | A | 11/1997 | Keating et al. |
| 5,710,723 | A | 1/1998 | Hoth et al. ............. 364/551.01 |
| 5,854,994 | A | 12/1998 | Canada et al. ................ 702/56 |
| 5,874,903 | A | 2/1999 | Shuey et al. ........... 340/870.02 |
| 6,018,700 | A | 1/2000 | Edel ........................... 702/60 |

(Continued)

FOREIGN PATENT DOCUMENTS

WO   WO 02/039242   5/2002

(Continued)

OTHER PUBLICATIONS

PCT International Search Report for Application No. PCT/US04/23006.

*Primary Examiner*—Edward R. Cosimano
*Assistant Examiner*—Sujoy K Kundu
(74) *Attorney, Agent, or Firm*—Brinks Hofer Gilson & Lione

(57) ABSTRACT

An energy measurement system including a radio frequency ("RF") device powered by a solar panel. The RF device comprising a wireless communication port operative to transmit and receive communication over a wireless network of additional RF devices. The energy measurement system able to transmit energy parameters of the RF device over the wireless network.

51 Claims, 17 Drawing Sheets

U.S. PATENT DOCUMENTS

| | | | |
|---|---|---|---|
| 6,052,364 A | 4/2000 | Chalmers et al. | 370/312 |
| 6,115,653 A | 9/2000 | Bergström et al. | 701/29 |
| 6,172,616 B1 | 1/2001 | Johnson et al. | 340/870.12 |
| 6,278,357 B1 | 8/2001 | Croushore et al. | |
| 6,373,399 B1 | 4/2002 | Johnson et al. | 340/870.11 |
| 6,437,692 B1 | 8/2002 | Petite et al. | 340/540 |
| 6,653,945 B2 | 11/2003 | Johnson et al. | 340/870.02 |
| 6,771,058 B2 | 8/2004 | Lapinksi et al. | 324/117 |
| 6,836,737 B2 * | 12/2004 | Petite et al. | 702/62 |
| 7,000,021 B1 | 2/2006 | Radhakrishnan et al. | 709/230 |
| 7,047,009 B2 * | 5/2006 | Laroia et al. | 455/437 |
| 7,079,551 B2 | 7/2006 | Shivnan | 370/469 |
| 7,089,089 B2 | 8/2006 | Cumming et al. | 700/295 |
| 7,251,570 B2 | 7/2007 | Hancock et al. | 702/57 |
| 2002/0019725 A1 | 2/2002 | Petite | 702/188 |
| 2002/0163770 A1 | 11/2002 | Shiue et al. | |
| 2003/0001754 A1 | 1/2003 | Johnson et al. | 340/870.02 |
| 2003/0009301 A1 | 1/2003 | Anand et al. | 702/62 |
| 2003/0067725 A1 | 4/2003 | Horvath et al. | |
| 2003/0098679 A1 | 5/2003 | Odaohhara | |
| 2003/0099221 A1 | 5/2003 | Rhee | 370/338 |
| 2003/0174067 A1 | 9/2003 | Soliman | 340/870.02 |
| 2004/0229578 A1 | 11/2004 | Lightbody et al. | |

FOREIGN PATENT DOCUMENTS

| | | |
|---|---|---|
| WO | WO 02/39242 A1 | 5/2002 |
| WO | WO 02/075565 | 9/2002 |
| WO | WO 02/080483 A1 | 10/2002 |
| WO | WO 03/047175 A1 | 6/2003 |
| WO | WO 2004/061462 | 7/2004 |
| WO | WO 2005/008181 | 1/2005 |

* cited by examiner

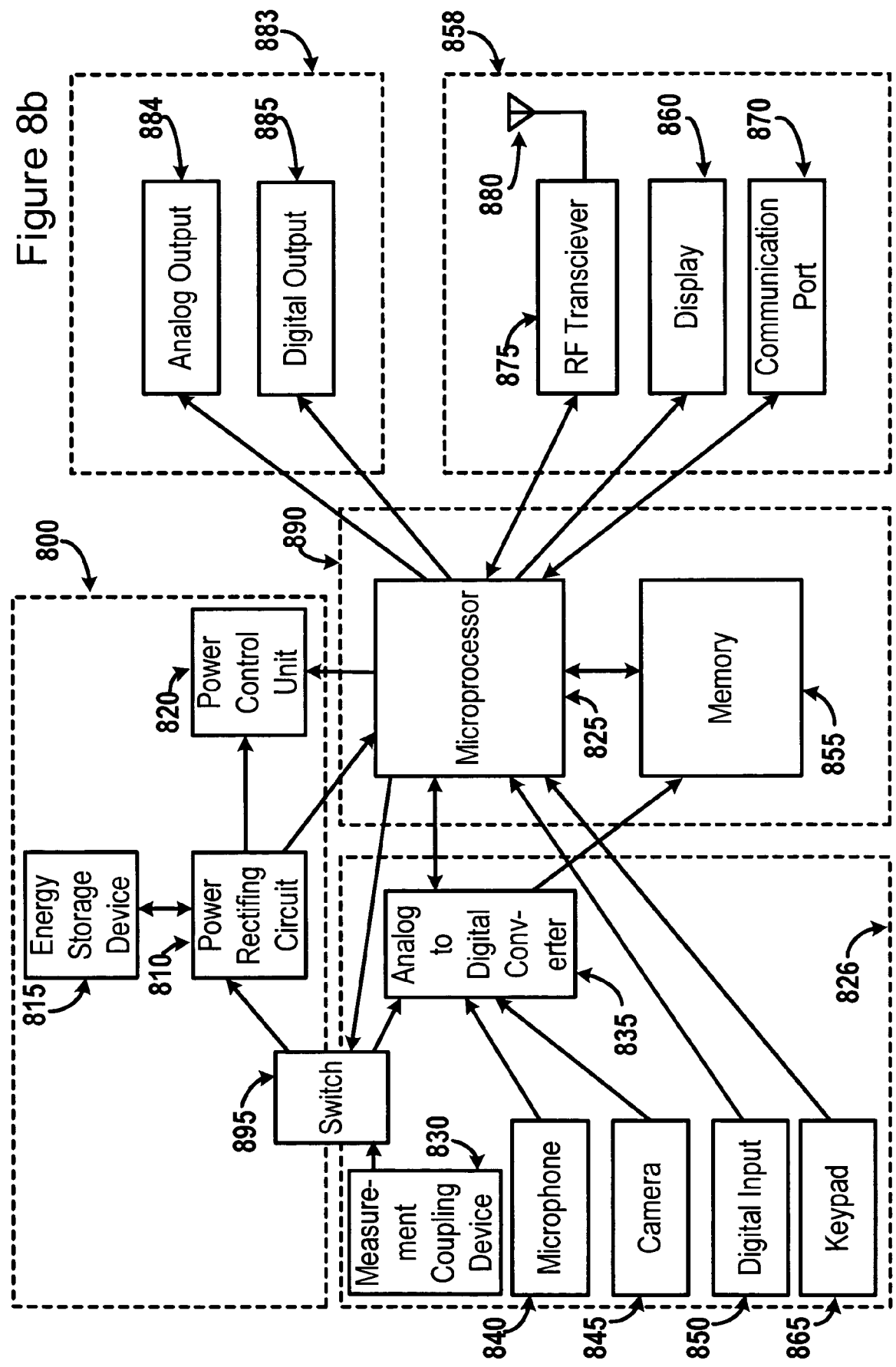

RADIO FREQUENCY DEVICE WITHIN AN ENERGY SENSOR SYSTEM

RELATED APPLICATIONS

The present patent document claims the benefit of the filing date under 35 U.S.C. §119(e) of Provisional U.S. Patent Application Ser. No. 60/554,188, filed Mar. 18, 2004 which is hereby incorporated by reference.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

The invention relates generally to the field of energy measurement devices used for monitoring energy flow in power systems. More specifically the invention relates to a measurement device that reduces the cost and complexity of the installation of the devices. More specifically the cost and installation of conduit, electrical wiring and communication wiring.

Intelligent Electronic Devices (IEDs) comprise, but are not limited to digital power/energy meters, protective relays, power quality measurement devices, fault recorders or other devices capable of interfacing to electric power lines and calculating at least one power parameter. Power parameters include, but are not limited to rms current, rms voltage, kW, kVAR, kVA, frequency, harmonics, kWh, kVARh, kVAh, power factor, symmetrical components, etc.

Current transformers are used to monitor the current flowing in power system conductors. Generally, current transformers consist of two types. The first type is the closed (toroidal or rectangular) type. The second type is the split core (clamp-on) type. The closed type consists of a toroidal or substantially rectangular section of magnetic material with a "window" or opening through the middle. The current transformers have at least one secondary transformer winding that is wound around the material and through the window. A primary winding normally consists of a power line in a power system passing through the window that forms a single transformer turn. The winding ratio of the transformer is then the ratio of the primary to secondary turns. Split-core type current transformers are of substantially the same shape as closed type current transformers with the addition of a split in the magnetic material such that the transformer can be placed around the primary winding without having to "thread" the primary winding through the window. This allows installation of the split-core type current transformer on power system cables without disconnecting them from their source or load.

Standard current transformers suffer from errors in both ratio and phase shift mainly due to the magnetization current required to excite the magnetic material of the core. These effects limit the accuracy of the current transformer and dynamic range of current the transformers are able to accurately sense. This is especially the case with split-core type current transformers due to the magnetic flux leakage caused by the split in the magnetic material.

An active or compensated current transformer circuit that corrects for such errors is described in U.S. Pat. No. 3,534,247 to Miljanic entitled "Current Transformer with Internal Error Compensation". This circuit provides a substantially zero phase shift and zero ratio error current transformation using a compensation amplifier. Powering the compensation amplifier from an additional current transformer is included in the active current transformer circuit. The presence of a separate powering current transformer means that additional wires are present beyond those providing the secondary current. This may make the device undesirable for installation in locations such as switchgear cabinets due to the high voltages present.

A second active current transformation approach is described in U.S. Pat. No. 4,841,236 to Miljanic et al. entitled "Current Ratio Device". This approach provides additional isolation over the approach of the U.S. Pat. No. 3,534,247 patent through the inclusion of an isolated additional secondary winding which provides advantages for uses in high accuracy metrology applications, but in general the accuracy of the approach of the U.S. Pat. No. 3,534,247 patent approach is more than adequate for most power system monitoring applications.

A self powered non-active current monitor for monitoring current in an electric power system is described in U.S. Pat. No. 6,018,700 to Edel entitled "Self-Powered Current Monitor". This circuit provides power for amplification circuitry, a microprocessor, etc. that is derived from the power line that is being monitored. The circuit includes a burden reducing circuit that allows current monitoring to be performed with the same magnetic core that is powering the circuitry. The monitoring function of this circuit is not continuous or the burden of the power supply reduces the accuracy of the current transformation and therefore this approach is difficult to use with accurate advanced power monitoring devices that continuously sample the current waveform in order to provide accurate power calculations and power quality functionality.

Typically metering a particular point within an energy distribution system, such as an electrical distribution system, can be very costly and there are monetary and practical barriers to installing metering points. Some of these costs are external components such as potential transformers or current transformers, commissioning, mounting, conduit and installation costs.

A large installation cost associated with metering points is the installation of communication wires including conduits for the communication wires. The availability of existing communication, cost of extending those communications, and the labor involved in running the communication wires can be prohibitive when evaluating the benefit of adding a new metering point. Alternatively, a metering point may be installed without any communication. In this case, someone must physically go to the meter and read a display, record the energy values, and transport this information to a central system. This approach is prone to human error in addition over time it is an expensive communication method.

Another large installation cost associated with some metering points is the cost of providing an adequate power supply or separate power supply to the metering device. For example, a metering device may be monitoring at a point of a large voltage potential, while the device may be able to monitor the voltage potential, the control power required for the device must be at a significantly lower potential. Alternatively, a metering device may be monitoring a non-electrical quantity such as the output of a flow meter. There may not be a conventional power supply for the metering device accessible; in which case, additional installation expense is required to provide control power to the metering device.

A further installation cost associated with the physical mounting to the metering point. Typically metering points must be mounted into a dedicated measurement cabinet or measurement rack of some sort with a hole for a display or mounting screws to secure the metering device to the cabinet or rack.

Typically the advantages of installing metering points closer to the supply of the energy outweigh the barriers; however, as the energy travels closer down the energy distribution system to the consumer and finally to the load, the costs of metering points often outweighs the benefits. However, there is a desire and financial benefit to monitoring energy distribution at additional metering points; especially further down the energy distribution system towards the load. When more information is known of the energy used, more can be done to reduce energy usage. In addition, more energy metering points allow tenants to be billed by actual energy costs rather than an approximation such as a energy cost proportional to rented square footage.

When these costs are reduced, the financial reward of energy cost analysis outweighs the reduced cost barriers of metering closer to each energy load. These additional metering points can assist in creating a clearer representation of energy costs throughout a facility and that information can assist the facility in reducing its energy costs.

SUMMARY

The present invention is defined by the following claims, and nothing in this section should be taken as a limitation on those claims. By way of introduction, the preferred embodiments described below relate to a method of monitoring energy through energy sensors communicating on an radio frequency ("RF") mesh network. The preferred embodiments further relate to a method of powering energy sensors through self powering sources. The preferred embodiments further relate to a method of installation and mounting of the energy sensors. Further aspects and advantages of the invention are discussed below in conjunction with the preferred embodiments.

BRIEF DESCRIPTION OF THE DRAWINGS

FIG. 8b depicts a block diagram of an energy sensor utilizing power derived from the measured energy signal to power the metering device;

DETAILED DESCRIPTION OF THE PRESENTLY PREFERRED EMBODIMENTS

Herein, the phrase "coupled with" is defined to mean directly connected to or indirectly connected through one or more intermediate components. Such intermediate components may include hardware, communication and software-based components. Additional intermediate components may include electrical field coupled and magnetic field coupled components. The figures included in this document refer to various groups of items using a number prefix and a letter as a suffix, such as 120a, 120b, and 120c. The number listed alone without the letter suffix refers to at least one of these items. An example of this is when a group of items such as the energy sensors 120 are referred to as energy sensors 120, this is meant to refer at least one of the energy sensors 120a, 120b, 120c, 120d, 120e, 120f, 120g, 120h, or 120i.

The present embodiments reduce the costs of energy metering by reducing the installation costs and commissioning costs for metering points. In addition, the present embodiments reduce the need for additional external components such as potential transformers, current transformers, and measurement cabinets. The present embodiments are able to reduce these costs by using various combinations of the following technology discussed below. By reducing these costs, the number of metering points within an energy distribution system, such as an electrical energy distribution system, may be increased; similar approaches may be used to increase the number of metering points throughout other energy distribution systems such as water, air, gas and steam distribution systems.

Figure 1:
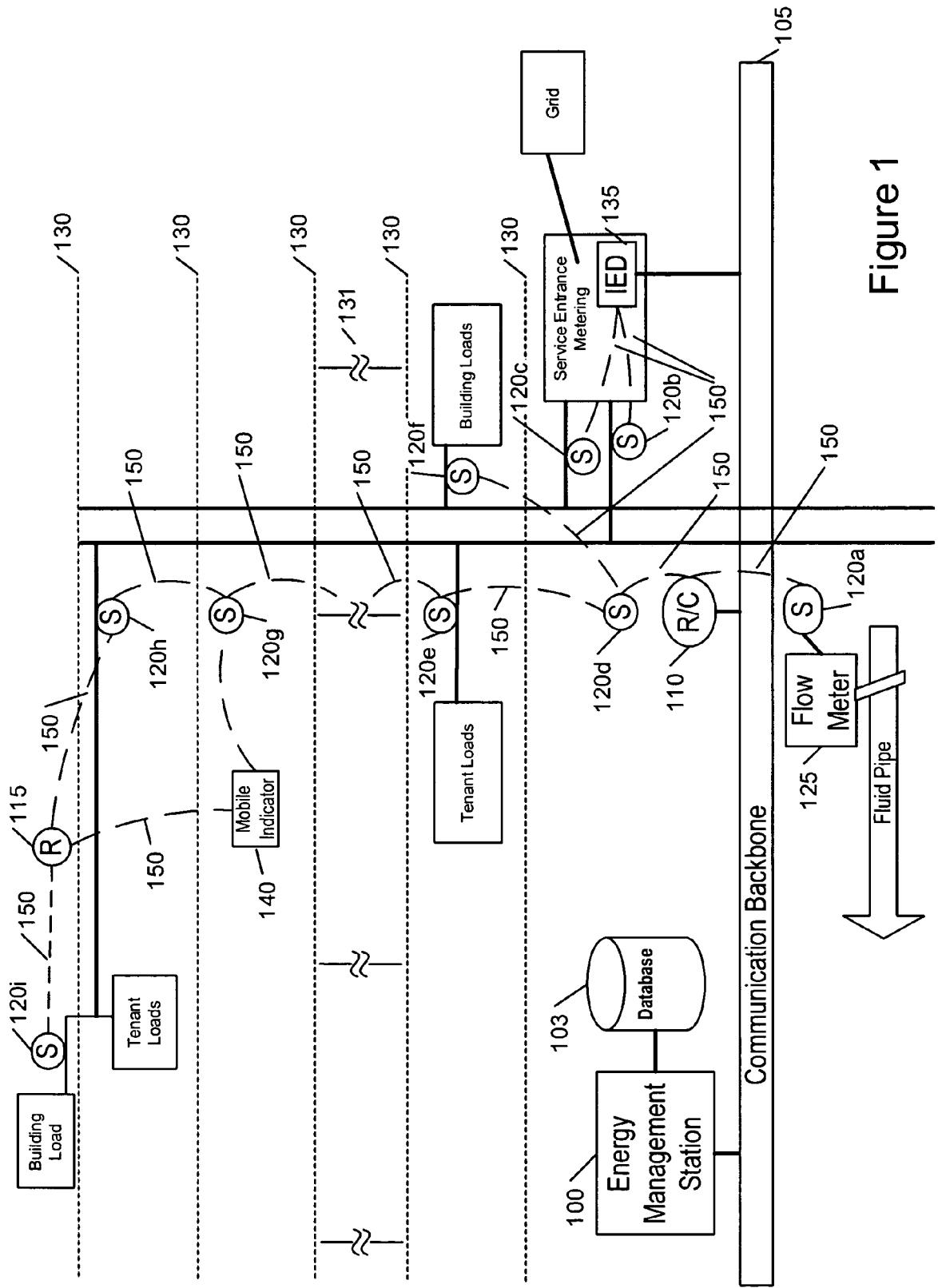
FIG. 1 depicts a system of energy sensors within a commercial building communicating over a wireless mesh network.

Referring now to FIG. 1, a wireless network composed of a radio frequency ("RF") repeater converter 110, RF repeater 115, and energy sensors 120 are used to transmit communication data packets between the energy management station 100 and the energy sensors 120. As shown in FIG. 1, this wireless network may be deployed within a commercial building space. An RF device includes at least one of RF repeater converter 110, RF repeater 115, energy sensors 120, RF signal strength sensors, or RF display devices 140. The RF devices make use of an RF mesh network for communication. Using RF communications, the present embodiments may be able to reduce the cost of metering an additional point or to reduce the cost of communicating an existing metering point in an energy distribution system back to the energy management station 100 or SCADA software by significantly reducing the cost of making communication wires available at the metering point and maintaining the communication wires between the energy management station 100 and the metering point.

The energy management station 100 may be software residing on a computer or firmware residing on an intelligent electronic device (IED). The energy sensor 120 is an IED that is able to meter at least one energy related parameter and communicate over an RF mesh network. An energy sensor 120 may include various measurement coupling devices. This allows the energy sensor 120 to measure or couple with measurements of various forms of energy. For example, an electrical energy sensor 900 depicted in FIG. 9b is an embodiment of the energy sensor 120 used for monitoring electrical energy parameters. An alternate embodiment of the energy sensor 120 may include a measurement coupling device such as a digital input used for a pulse counter used to read pulses. An example is shown in FIG. 1, where an energy sensor 120a is monitoring pulses from a flow meter 125 over a pulse connection. These pulses may originate from another energy meter that may measure water, air, gas, electrical or steam energy. An alternative embodiment may contain a measurement coupling device that directly couples with the energy being measured.

The energy management station 100 is coupled with a RF repeater converter 110 via the communication backbone 105. The RF repeater converter 110 may allow the energy management station 100 to communicate over the network and receive data from the energy sensors 120 within the wireless network. The energy management station may have a connection to a communication backbone 105, such as an Ethernet Network, LAN or WAN, or to an alternative communication medium and may be able to communicate to the wireless network through a RF repeater converter 110 that is connected to an alternative medium, such as a satellite or telephone connection. The alternative communication medium or communication backbone can be composed of any communication channel such as a phone network, Ethernet, intranet, Internet, satellite, or microwave medium.

In FIG. 1, the wireless communication paths 150 represent some of the possible wireless communication paths possible between the RF devices. The wireless network technology used is an adhoc wireless mesh network technology. An adhoc network may have no infrastructure or may comprise an unplanned infrastructure. The adhoc network allows for a communication network to be setup with careful infrastructure planning in advance typically required with communication networks such as wired Ethernet networks. A mesh network is a network that may contain multiple paths to communicate information. A mesh network comprises a number of RF devices. Typically each RF device is capable of receiving messages from other RF devices and that RF device retransmitting the message onto the mesh network.

An example of this is shown in FIG. 1, where the energy sensor 120e may transmit a message containing an energy measurement it has taken with the intended recipient the energy management station 100. The initial transmission from sensor 120e may only be received by the RF devices within transmission range of sensor 120e. The communication packet 1000 may contain transmission route information 1020 such as how many hops, or direct device to device communication transfers, between RF devices were required last time a message was sent or received from energy management station 100. If another RF device, such as energy sensor 120g, receives the message from energy sensor 120e, it maybe able to compare the number of hops the transmissions usually take to be received the destination and compare this to the number of hops indicated in the communication packet 1000 and determine if it should retransmit the message based on the a reduction in the number of hops required from the transmission. The same evaluation process maybe carried out by other communication indicators such as a measure of signal to noise ratio or a measure of success rate. In the above example, energy sensor 120d would determine that it is one hop closer to the energy management station 100 and retransmit the communication packet 1000. The energy sensor 120d may add it's route information such as how many hops between other RF devices where required last time a message was sent or received from energy management station 100 to itself. Further, storing and evaluating the route information allows the RF devices and the mesh network system to monitor and react to the communications efficiency of data communications.

RF devices such as RF repeater converters 110, RF repeaters 115, energy sensors 120, and RF display devices 140 that use the adhoc wireless mesh networking technology may be automatically recognized by the other RF devices within communication range. These additional RF devices can be used to extend the wireless network range, bandwidth, throughput, and robustness. For example, if an energy sensor 120i is installed in an area that is not currently within the range of the mesh network, the installer need only add at least one appropriate RF repeater 115 to extend the range of the mesh network. In another example, the system may be designed with a second RF repeater 115 that overlaps some of the service area of the first RF repeater 115, in this scenario the energy sensor 120i that is in the overlapped area has at least two different communication paths back to the energy management station 100. This increases the robustness of the system in that if the first RF repeater is damaged or is temporarily blocked due to RF noise, the energy sensor 120 may still be able to communicate via the second RF repeater 115. The mesh network can be made secure such that additional RF devices must be either secured to the network or contain a security key that is accepted by an authentication device within the network. The communication security may comprise a public and private key system where the encrypted or signed data and the public key are transmitted on the RF mesh network.

The RF devices may be able to automatically modify their RF transmission power to only be as strong as required to reach an RF repeater or other RF device in the mesh network with adequate signal to noise ratio (SNR). This adjustment of RF transmission power may be referred to as a RF power control. For example, the microprocessor 825 within the RF device may slowly increase power until at least one RF device closer to the target, for instance the energy management station 100, successfully receives the message. Alternatively, when a communication packet 1000 is received from another RF device, that packet may contain the set transmission power of that RF Transceiver 875. The transmission power information may be used by itself or with another measure such as signal to noise by the microprocessor 825 to determine the required RF transmission power of the RF Transceiver 875.

Another example of microprocessor 825 controlling the RF transmission power of the RF Transceiver 875 may occur if a transmission is sent from the source RF device and is picked up by at least two separate RF devices. The source RF device may receive the communication packet as retransmitted by both RF device and may either modify the next communication packet so that it is not repeated by one of the devices or modify the transmission power of its RF transceiver 875 so that only one RF device is within RF range of the transmission. This has an added benefit of reducing the range of the RF transmission zones to increase security as well as reduce the power requirement of the RF repeater. If the RF device that transmits the communication packet does not receive confirmation of successful transmission or does not see the packet retransmitted from another RF device, the transmitting RF device may increase the transmission power in an attempt to reach another RF device within the mesh wireless network.

The RF device's control over the RF transmission power may be used to create mesh zones. An RF zone may be used if a number of RF devices are within communication range of each other but by limiting their RF transmission power they would limit their range of their RF transmissions to be within a RF zone. At least one of the RF devices participating within this RF zone would act as a repeater or gateway to the rest of the mesh network. The RF device may be able to dynamically modify their RF transmission power depending on the communication packets intended destination or next intended hop to their destination.

As a result of the RF devices ability to modify their transmission range, the network security may be enhanced as RF power is set to a minimum required level. In addition, the RF devices power supply requirements are lowered.

The installation of mesh networks such as the energy sensor 120 or RF repeater 115 can be complicated by intermittent network connections due to marginal transmission and reception of data over the network. During the commissioning of the system, all that can normally be done is to verify that each RF device 120 can ultimately communication with the energy management system 100. This verification simply tells the installer that the system is currently working properly, but it does not tell how much operating margin the radios have. For low cost devices, it is usually not feasible to include measurement of signal strength.

The operating conditions of a mesh network radio can change due to near body effects, temperature, interference, fading and multipaths. If RF device 120 reception is close to the operating limit of the radio, then small changes of the operating conditions can render a RF device 120 non-communicating, potentially resulting in one or more RF devices 120 no longer in communication to the energy management station 100.

This disclosure proposes the use of a RF device 120 with a variable RF power to validate the correct operation of the system at a reduced RF power level. During commissioning the system is switched to lower power mode. The RF device 120 may have either or both a variable RF transmission power and a variable RF reception capability. Once the mesh network has been verified to be fully operational, the system is switched to operating mode. This verification may require the installation of appropriate RF repeater 115 or RF repeater converters 110 to complete the network. During normal operation the mesh network node power may be increased to a higher (normal) power level assuring that the reception and transmission of mesh network data is well above any marginal radio operating parameter. Alternatively, the power level may be allowed to be increased to the higher (normal) power level if the RF device is operable to automatically adjust it's transmission power during normal operation.

The RF repeaters 115 are used to receive and retransmit wireless packets between the energy sensors 120 and the energy management station 100 or between two RF devices. For example, the RF repeater 115 may facilitate communication between energy sensor 120$i$ and energy sensor 120$h$ or RF display device 140. These RF repeaters 115 may be capable of performing routing of the wireless packet. These routing tables may be stored in the RF repeater in non-volatile memory so that after a power outage, network communication can quickly be restored. The RF devices may use a self-healing feature that makes use of a network architecture that can withstand a failure in at least one of its transmission paths such as a mesh or partially mesh network. The self-healing feature may allow an RF device to redirect a communication packet such as to avoid a nonfunctioning RF repeater 115 or RF device. In addition, the RF repeaters 115 may be able to determine if they are the final destination for a communication packet, decode the packet, and further carry out the instruction provided. This instruction can be the modification of a setup within the RF device, request to read a register, part of a firmware upgrade, communication acknowledgment, or an instruction to generate an alternate communication packet. At least a portion of the RF repeater 115 may be implemented within an ASIC chip.

The RF repeater converters 110 or gateway device 110 may be used to repeat the RF signals as necessary in a similar manner as the RF repeaters 115. In some cases, the RF repeater 115 functionality may be left out of the RF repeater converters 110 to reduce cost; however, when the RF repeater converters 110 have this capability there can be an additional cost savings as the network is extended without the requirement of a RF repeater 115. In addition, the RF repeater converters 110 may be operable to provide a bridge between the wireless mesh network and other communication devices such as a Ethernet backbone, power line carrier, phone network, internet, other wireless technologies, microwave, spread spectrum, etc. In addition, the RF repeater converters 110 may be able to determine if they are the final destination for a communication packet, decode the packet, and further carry out the instruction provided. This instruction can be the modification of a setup within the RF device, part of a firmware upgrade, communication acknowledgment, or an instruction to generate an alternate communication packet. At least a portion of the RF repeater converter 110 may be implemented within an ASIC chip.

The energy sensors 120 may be capable of repeating the RF signals in the same way as the RF repeaters 115. In some cases, the RF repeater 115 functionality may be left out of the energy sensor 120 to reduce cost; however, when the energy sensors 120 have this capability there can be an additional cost savings as the network is extended without the requirement of an RF repeater 115. Energy sensors 120 that can act as RF repeaters 115 can increase the range and robustness of the network as well as reduce the number of components required to make up the wireless mesh network. The sensors 120 have the additional task of generating a communication data packet containing a measurement that they have taken or calculated. In addition, the energy sensor 120 may report the status of the energy sensor 120. In addition, the energy sensors 120 may be able to determine if they are the final destination for a communication data packet, decode the packet, and further carry out the instruction provided. This instruction can be the modification of a setup within the energy sensor 120, request to read a register, part of a firmware upgrade, communication acknowledgment, or an instruction to change an output or control a device. An energy sensor 120 is used to monitor or measure at least one energy parameter. This energy parameter may be monitored directly, indirectly or via another monitoring device such as an energy meter with a pulse output or an energy meter with a communication port. Alternately, the energy sensor 120 may monitor a parameter that has an effect on an energy distribution system such as temperature, vibration, noise, breaker closure, etc. At least a portion of the energy sensor 120 may be implemented within an ASIC chip.

The RF devices may include wireless RF display devices 140. These RF display devices 140 may be mobile, mounted or adhered to the outside of a measurement cabinet. The RF display devices 140 may display readings or alarms from one or more energy sensors 120. These energy sensors 120 may be within the measurement cabinet, in the vicinity of the RF display device 140, or accessible via communications over the RF network. The display devices 140 may contain user interfaces such as keypads, stylists or touch screens that allow access to various displays and quantities within the energy sensors. The RF display device 140 may be mobile and used to communicate to more than one energy sensor 120. Alternatively, the RF display device 140 may communicate to the energy management station 100 and display information or alarms from the energy management station 100. In addition, these RF display devices 140 are able to correlate various readings from different energy sensors 120 or specified values, perform calculations and display various parameters or derivations of parameters from the energy sensors 120 they have access to on the wireless mesh network. For example, if an IED 135 is able to measure the voltage on the bus or the voltage is a specified constant and the expected power factor is supplied, the RF display device 140 is able to correlate the values and calculate various energy parameters, such as kVA, kVAR and kW with at least usable accuracy, and display them on the screen or log them into memory. A permanently or semi-permanently mounted RF display device 140 may be usable as active RF repeater 115 to boost the RF signals from sensors within a measurement cabinet or within the vicinity of the RF display device 140. At least a portion of the RF display device 140 may be implemented within an ASIC chip.

The energy sensors 120 are able to take a measurement directly and provide the data wirelessly to the energy management station 100 via the RF repeaters 115 and RF repeater converters 110. Alternatively, the energy sensors 120 or other RF devices can be built into the IED 135 directly such as represented with IED 135. In this example, the energy sensor 120*b* and energy sensor 120*c* may communicate to the energy management station 100 through a RF gateway integrated into IED 135 which is connected to communication backbone 105. Depending on the integration of the RF device within the IED 135, the RF device may be able perform IED setup, modification to registers, firmware upgrade and control of the IED 135. In an alternate configuration, a RF repeater converter 110 may be connected to a communication port such as a RS232 port on the IED 135. For example, the communication port 870 may be wired directly to a RS 232, RS 485, USB or Ethernet port on the IED 135. The RF device, such as the repeater converter 110, may be operable to receive wireless communication over the mesh network and if that communication is addressed to an IED 135 connected to the RF device, the RF device would provide the information to the IED 135 over the communication port 870. Further, if the IED 135 sent a message or a response to a message received over the RF device, the RF device may be able to transmit the message onto the wireless mesh network. This effectively would enable a legacy IED 135, an IED 135 device without RF wireless communications, to send and receive packets over the wireless mesh network, using the RF device to send and receive communication packets. The RF device acting as this interface may modify the communication packets to change protocol or add routing information. The RF device may act as a data concentrator where the energy data may be manipulated before transmission such as receiving voltage data from one sensor and current data from another sensor and combining such data. More than one legacy device or IED 135 may be connected to the communication port. This may be complete using more than one communication channel for example two RS 232 interfaces or using an interface such as RS 485 that allows more than one device sharing one communication channel. For example, if there were a number of IEDs connected over RS 485, the RF device would be able to coordinate communication to each individual IED on the RS 485 communication line. Alternatively, there may be a more direct coupling between the two communication ports.

Further, the RF repeater converter 110 may be able to draw power from the communication port of the device to power itself and provide full communication to the device over the wireless mesh network. Three examples of the power available from a communication port are power provided by a USB communication port, power over Ethernet, or parasitic power drawn from an RS-232 port. Alternatively, the RF repeater converter 110 can be powered from an external power source or powered by an alternative power source described later on in this document.

Figure 2:
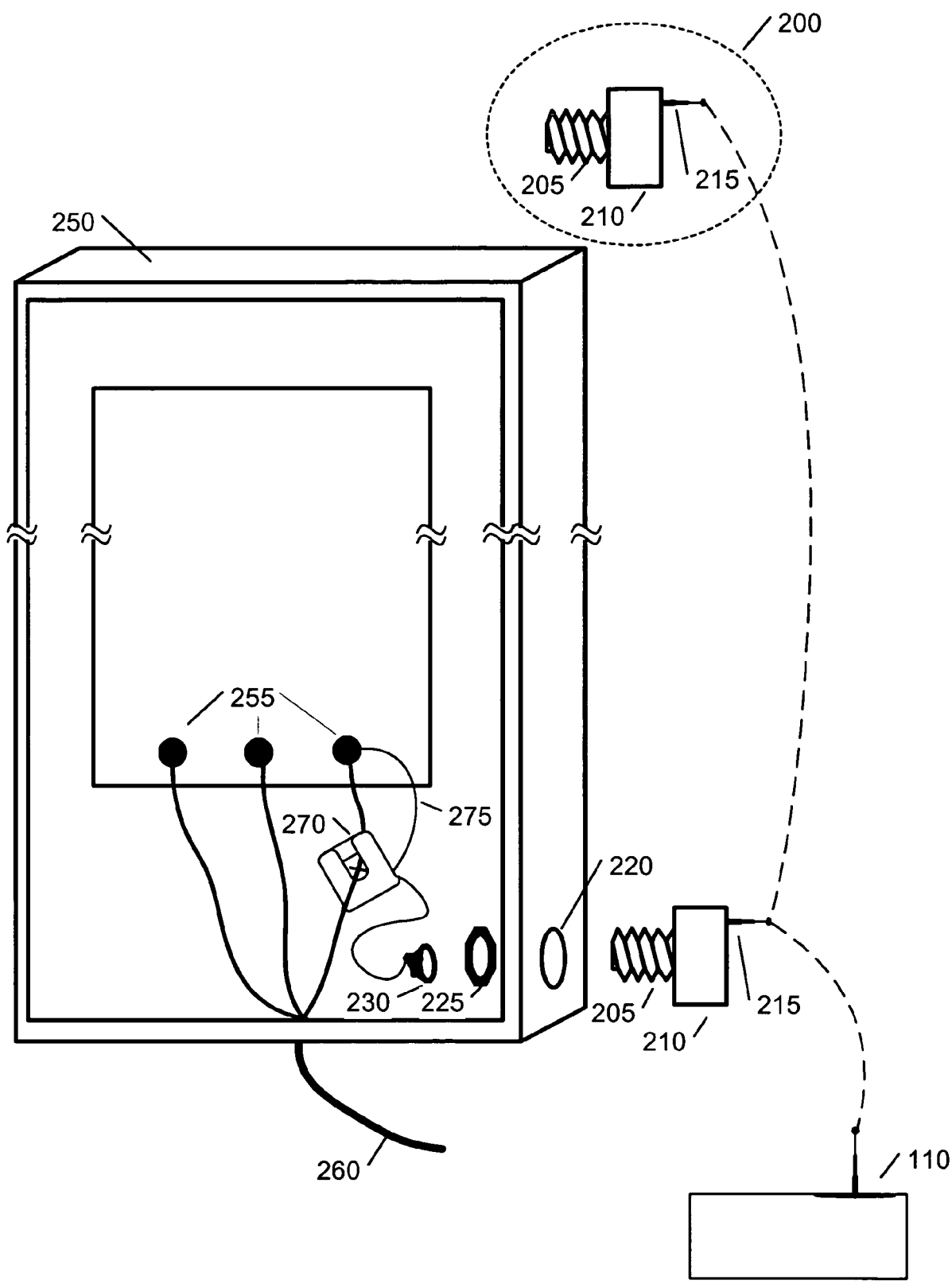
FIG. 2 depicts an embodiment of an electrical energy sensor mounted to the outside of a distribution panel.

Referring now to FIG. 2, an embodiment of the energy sensor 120 is shown as well as the installation of the energy sensors 120 within a distribution cabinet 250. The distribution cabinet 250 may be but is not limited to a breaker box, fuse box or transformer cabinet. This embodiment of the energy sensor 120, knockout energy sensor 200, comprises a mounting section 205, electronics box 210, antenna 215, and mounting ring 225. The mounting ring 225 may not be necessary to secure the knockout energy sensor 200 to the distribution cabinet 250. This knockout energy sensor 200 is designed to mount within an opening 220 within the cabinet 250. This opening 220 may be on the side, front, top or bottom of the distribution cabinet 250. In addition, this opening 220 may be a standard knockout hole, drilled opening or punched opening into the cabinet 250. The current transformer 270 and voltage connection 275 are coupled with a plug 230 that is designed to connect to the end of the mounting section 205. There may be more than one current transformer 270 and voltage connection 275. Alternatively, the voltage connection 275 may be removed and a voltage and power factor may be assigned to calculate power and energy readings. The electrical feed 260 for this cabinet 250 is connected to the terminals 255 within the distribution cabinet 250. The knockout energy sensor 200 embodiment of the energy sensor 120 may be able to repeat messages from other RF devices to another RF device such as a energy sensor 120 or gateway 110. This embodiment of the energy sensor 120 is able to reduce costs associated with installation and commissioning of an energy metering point by eliminating the need for purchase and installation of conduit for the measurement signals from the current transformers and voltage transformers or connections as well as the conduit normally required for communication wiring. In addition, this embodiment of the energy sensor 120 removes a requirement to have an additional electronic measurement box mounted or mounting area in the vicinity of the distribution cabinet 250.

Figure 3:
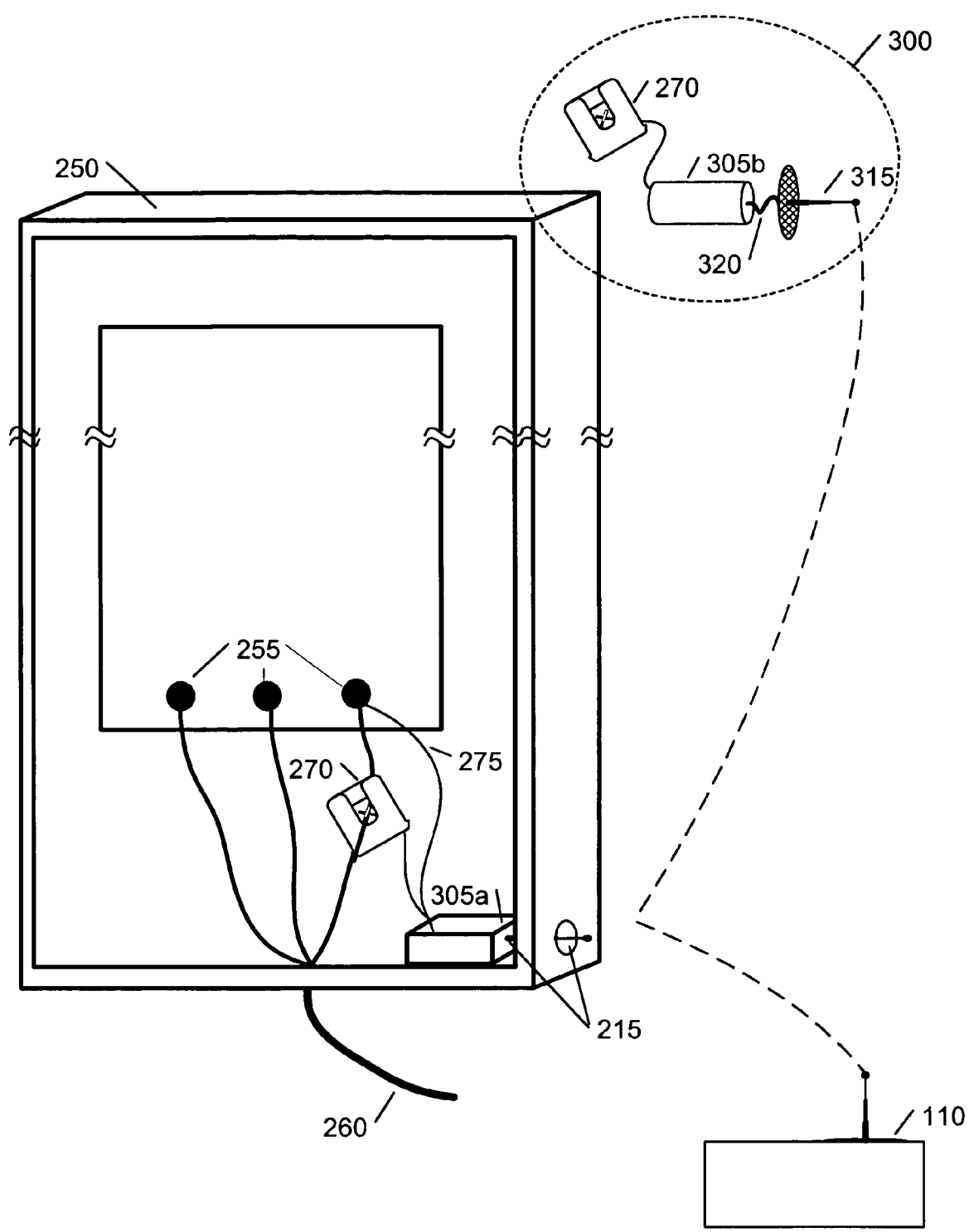
FIG. 3 depicts an embodiment of an electrical energy sensor mounted to the inside of a distribution panel.

Referring now to FIG. 3, an embodiment of the energy sensor 120 is shown as well as the installation of the energy sensors 120 within a distribution cabinet 250. This embodiment of the energy sensor 120, interior cabinet sensor 300, comprises an electronics box 305 and antenna 215. The interior cabinet sensor 300 may have an internal antenna, and external antenna 215 or may use an externally mounted antenna 315 connected by a coaxial cable 320. The interior cabinet sensor 300 may be mounted such that an attached antenna 215 may be able to be exposed outside of the distribution cabinet 250 via an opening in the cabinet 250 such as a knockout or punched hole. Alternatively, the antenna 215 may be mounted to the outside of the cabinet and connected via a coaxial cable to the electronics section 305. The electronics section 305 may be enclosed within an insulating material such as heat shrink or plastic and may be a cylindrical shape as shown by electronics section 305*b* or a rectangular shape as shown by the electronics section 305*a*. A rectangular shape may be easier to install to a side or interior corner of the distribution cabinet 250. A cylindrical shape may be more likely to be accepted as an extension of the wire and may not require any special mounting within the cabinet. This interior cabinet sensor 300 is designed to mount within the distribution cabinet 250. The antenna may optionally be installed exterior to the cabinet 250 through an opening. This opening may be on the side, front, top or bottom of the distribution cabinet 250. In addition, this opening may be a standard knockout hole, drilled opening or punched opening into the cabinet 250. The current transformer 270 and voltage connection 275 are coupled with the electronics section 305. There may be more than one current transformer 270 and voltage connection 275. Alternatively, the voltage connection 275 may be removed and a voltage and power factor may be assigned to calculate power and energy readings. The interior cabinet sensor 300 embodiment of the energy sensor 120 may be able to repeat messages from other RF devices to another RF device such as a energy sensor 120 or gateway 110. This embodiment of the energy sensor 120 is able to reduce costs associated installation and commissioning of an energy metering point by eliminating the need for purchase and installation of conduit for the measurement signals from the current transformers and voltage transformers or connections as well as the conduit normally required for communication wiring. In addition, this embodiment of the energy sensor 120 removes a requirement to have an additional electronic measurement box mounted or mounting area in the vicinity of the distribution cabinet 250. In addition, this embodiment of the energy sensor 120 requires small clearance area outside of the distribution cabinet 250.

Figure 4:
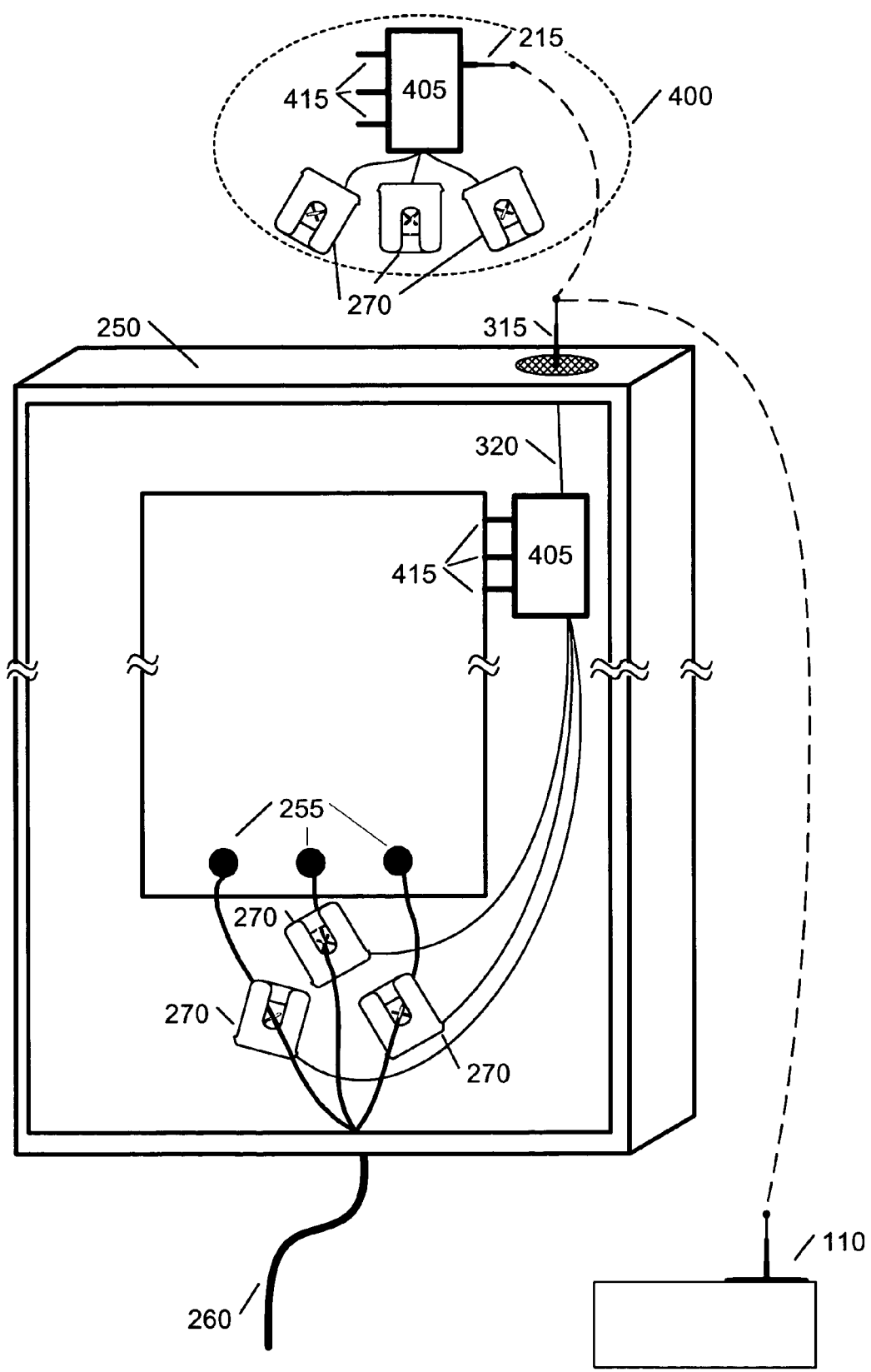
FIG. 4 depicts an embodiment of an electrical energy sensor mounted to the inside of a distribution panel with an antenna mounted externally on the distribution panel.

Referring now to FIG. 4, an embodiment of the energy sensor 120 is shown as well as the installation of the energy sensors 120 within a distribution cabinet 250. This embodiment of the energy sensor 120, voltage mounted sensor 400, comprises an electronics box 405, mounting connection 415, current sensor 270 and antenna 215. The wireless radio may use an internal antenna or may use an external antenna 215. Alternatively, the antenna 315 may be mounted to the exterior of the electronics section 405 and connected via a coaxial cable 320. The voltage mounted sensor 400 is suspended from the mounting connection 415. These mounting connection 415 may be conductive and used to make a voltage connection 275 (not shown on FIG. 4) from the electronics section 405 to the breaker connection that it mounts to. There may be more than one mounting connection such as shown in FIG. 4 where there are three mounting connections 415 that may be used to measure three phases of voltages. The voltage mounted sensor 400 may have an internal antenna, exterior antenna 215 or alternatively there may be a coaxial cable 420 that allows the radio to use an externally mounted antenna 315 that is mounted to the outside of the distribution cabinet 250. The electronics section 405 may be enclosed within an insulating material such as heat shrink or plastic. This voltage mounted sensor 400 is designed to mount within the distribution cabinet 250. The current transformer 270 and voltage connections 275 are coupled with the electronics section 405. There may be more than one current transformer 270 and voltage connection 275. Alternatively, a voltage connection 275 may be removed and a voltage and power factor may be assigned to calculate power and energy readings. The voltage mounted sensor 400 embodiment of the energy sensor 120 may be able to repeat messages from other RF devices to another RF device such as a energy sensor 120 or gateway 110. This embodiment of the energy sensor 120 is able to reduce costs associated with installation and commissioning of an energy metering point by eliminating the need for purchase and installation of conduit for the measurement signals from the current transformers and voltage transformers or connections as well as the conduit normally required for communication wiring. In addition, this embodiment of the energy sensor 120 removes a requirement to have an additional electronic measurement box mounted or mounting area in the vicinity of the distribution cabinet 250. In addition, this embodiment of the energy sensor 120 may only require a small clearance area outside of the distribution cabinet 250. In the case without an externally mounted antenna, no additional clearance area is required on the outside of the distribution cabinet 250.

Figure 5:
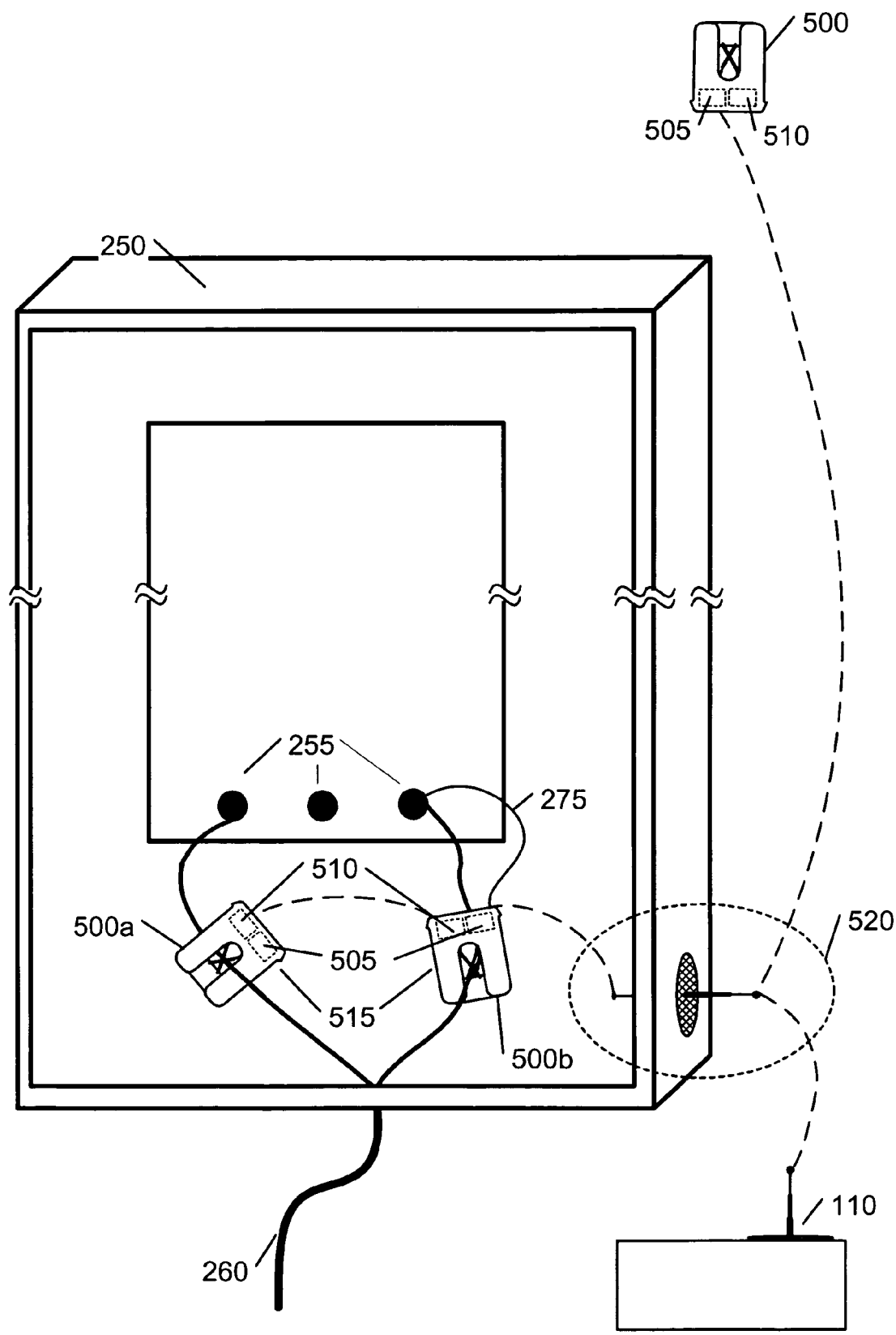
FIG. 5 depicts an embodiment of a single phase electrical energy sensor with wireless communications mounted within a distribution panel using a passive dipole antenna.
Figure 6:
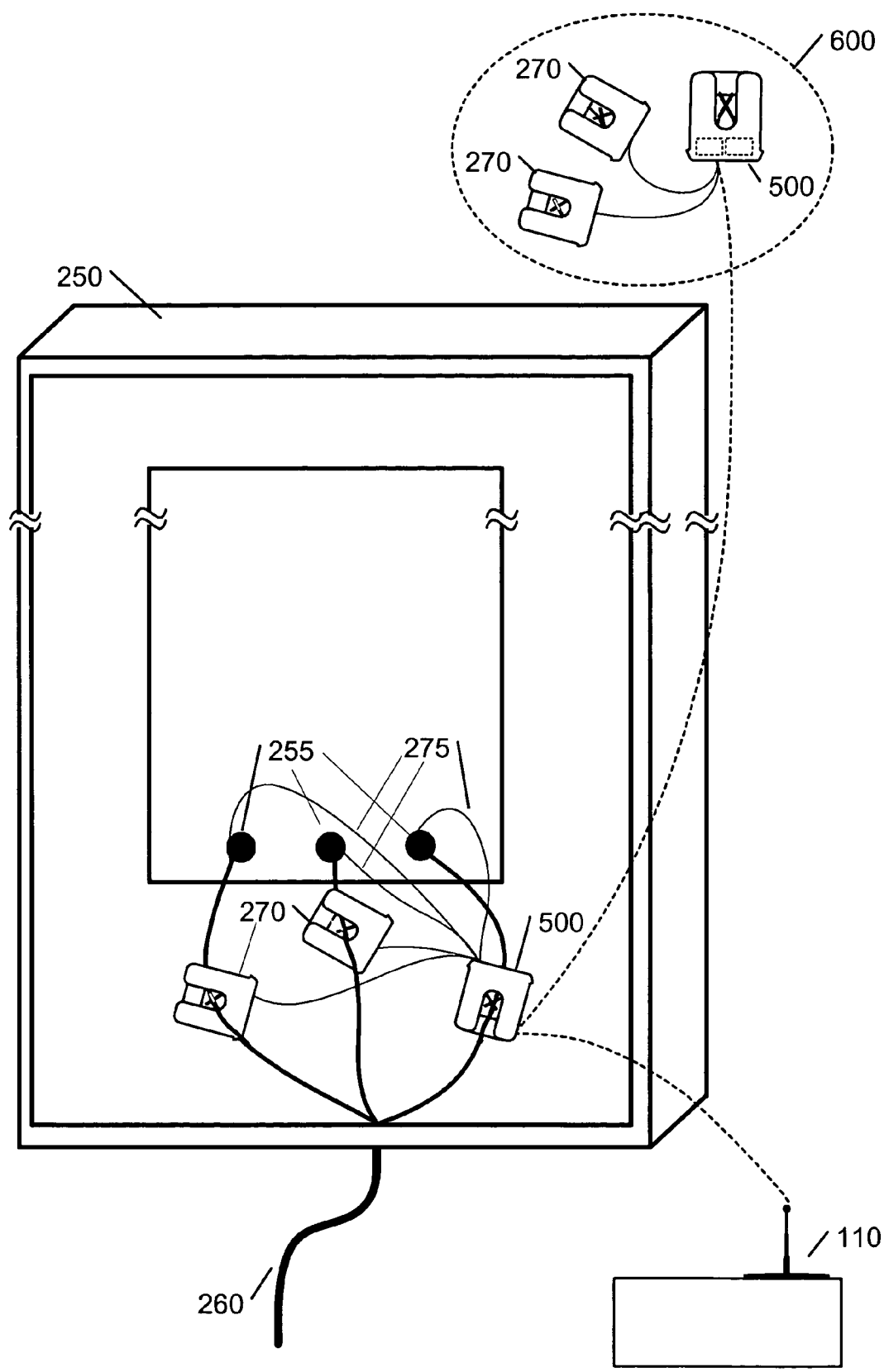
FIG. 6 depicts an embodiment of a three phase electrical energy sensor with wireless communications mounted within a distribution panel with separate CTs.
Figure 7:
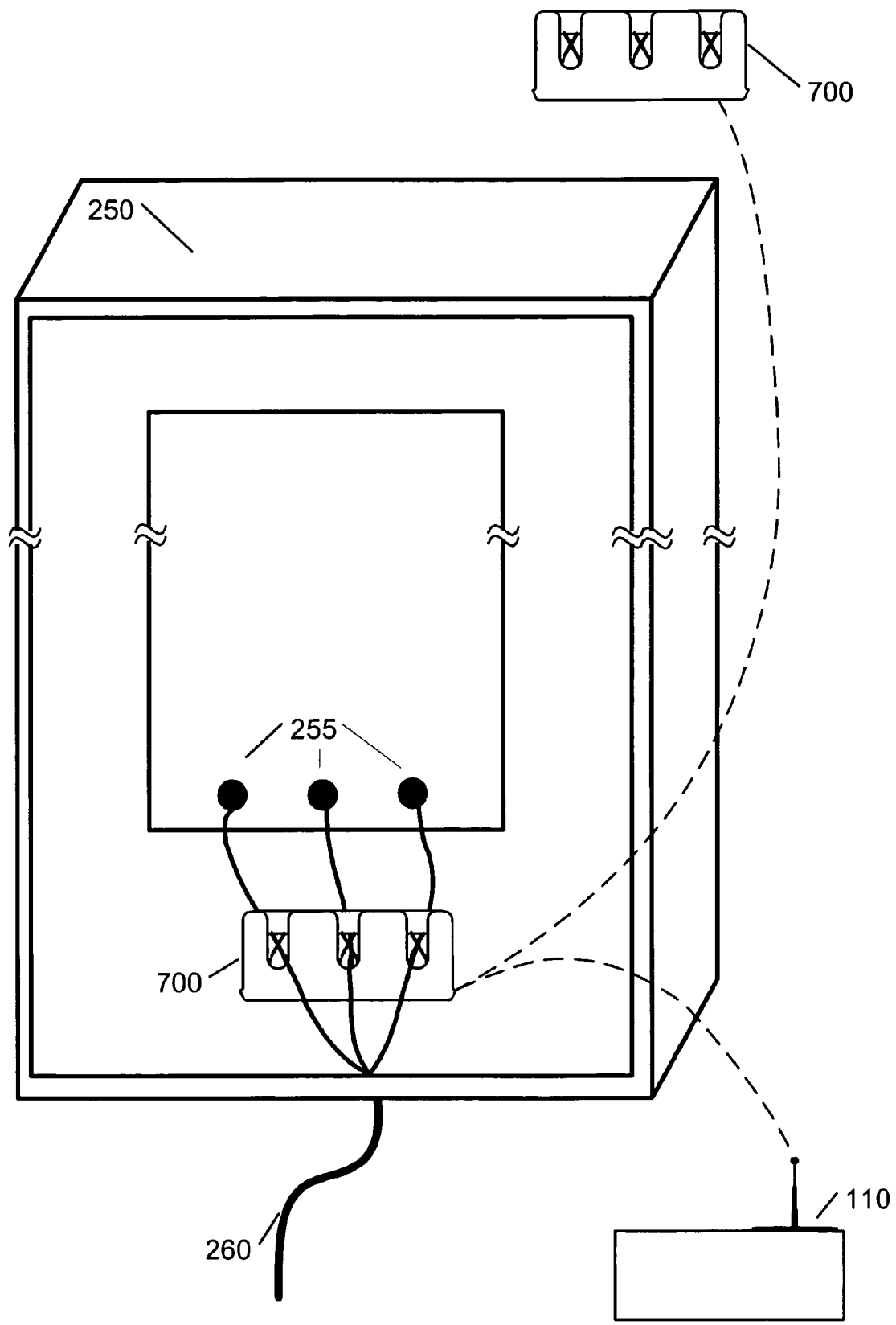
FIG. 7 depicts an embodiment of a three phase electrical energy sensor with wireless communications mounted within a distribution panel.

Referring to FIG. 5, an embodiment of the energy sensor 120 is shown. This embodiment integrates a wireless communication device, meter electronics, and current sensor within one device, an integrated wireless energy sensor 500. The integrated wireless energy sensor 500 is able to repeat signals from other RF devices. In addition, the integrated wireless energy sensor 500 may be able to retrieve other readings from a second integrated wireless energy sensor 500 and perform arithmetic on these readings and its own measurements. This way it is possible to monitor a multiphase system. This is shown in FIG. 5 by integrated wireless energy sensor 500*a* and integrated wireless energy sensor 500*b*. The communication link between these devices may be made by an optical link or an RF link. Alternatively, as shown in FIG. 6, there may be a wired link between an integrated wireless energy sensor 500 and a current transformer 270 or another integrated energy sensor 500. A set of the integrated wireless energy sensor 500 and current transformers 270 are used to monitor a multiphase electrical system. Alternatively, the set of integrated wireless energy sensor 500 and current transformers 270 may be used to monitor a number of feeders that may be on the same electrical phase and sum up the readings each take to create a virtual energy sensor that monitors the energy feeding each of the monitored feeders. FIG. 7 depicts a single device with three current transformers, wireless radio, and meter electronics integrated into one unit. This single device may additional comprise voltage connections 275 (not shown on FIG. 7). This solution offers a simple, compact installation at the base of most distribution cabinets 250 where the incoming electrical feeds are connected to the terminals 255.

The voltage connections 275 on any of these embodiments may be made when a split core current transformer is slipped onto the conductor by a metal object piercing the insulation to make a voltage connection to the electrical conductor. In addition, all of the above described embodiments may use a coaxial cable to connect to an external antenna 315 mounted to the distribution box 250 or mounted remotely from the energy sensor 120.

Figure 8A:
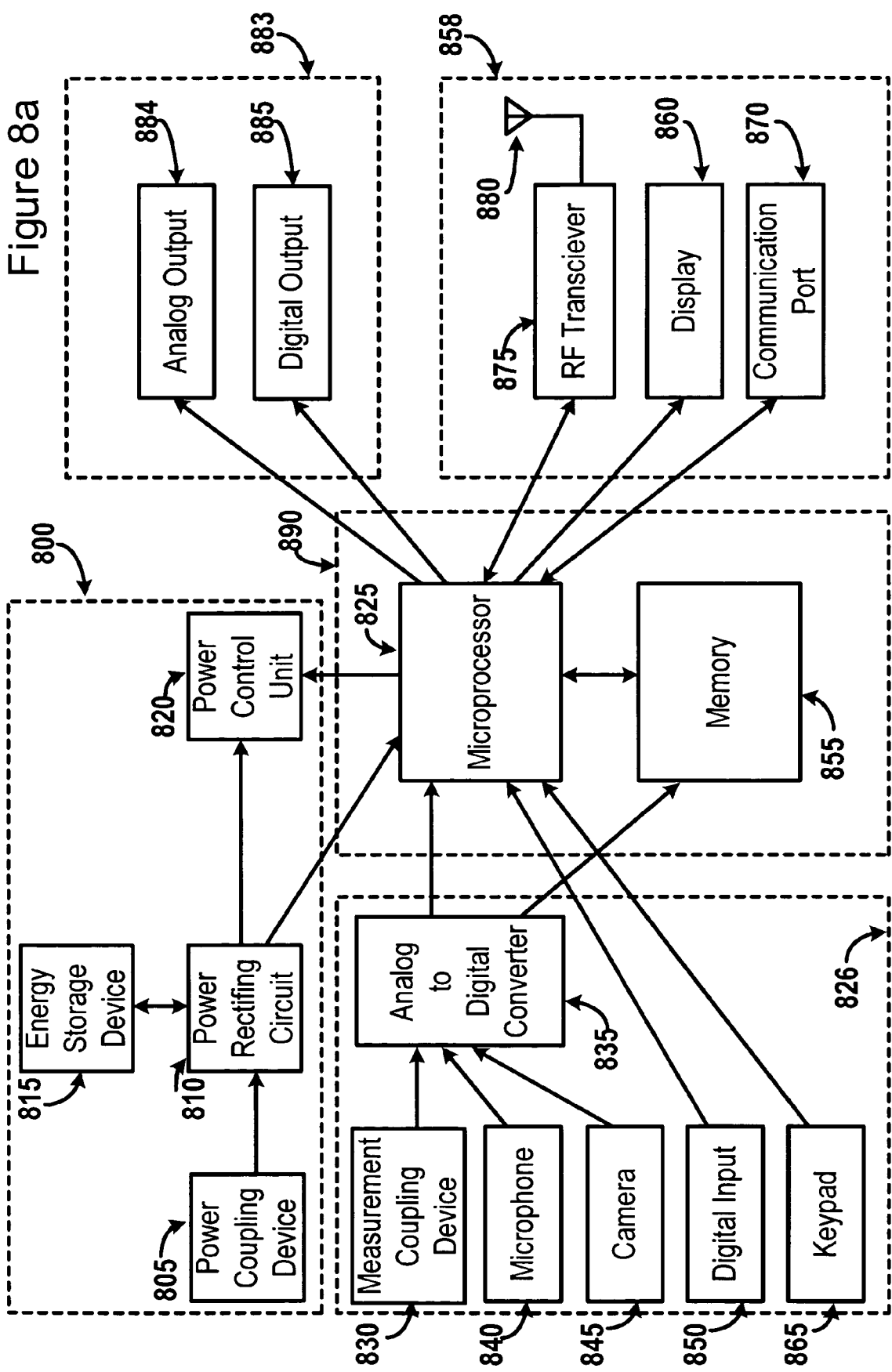
FIG. 8a depicts a block diagram of an energy sensor.

Referring to FIG. 8*a*, a block diagram of the internal components that may be used in an energy sensor 120 is depicted. The energy sensor 120 and other RF devices such as the RF repeater converter 110, RF repeater 115, RF display device 140, and RF strength sensor may be derived from a limited combination of the internal components of a full featured energy sensor 120 described below.

The energy sensor 120 may contain five sections, a power section 800, a measurement section 826, a communication section 858, control section 883 and a processor section 890. Each of these sections is discussed in more detail below. The energy sensor 120 may be completely implemented within an ASIC chip or alternatively any combination of the blocks described to make up the energy sensor 120 may be implemented within an ASIC chip.

The power section 800 may comprise of a power coupling device 805, a power rectifying circuit 810, energy storage device 815, and a power control unit 820. The power-coupling device 805 is used to couple with the alternate power source. This may be but is not limited to a thermal electric generator, solar panel 1310, electrical power, battery, or vibration generator. The power rectifying circuit 810 is used to convert an alternating or fluctuating power source to a more stable DC power source. It may use the energy storage device 815 to store excess energy that in turn is able to supply power when the alternate power source is unable to supply required power for the device. The energy storage device 815 is typically a super capacitor or rechargeable battery. For example, this energy storage device 815, super capacitor or rechargeable battery, may be used to store an electric charge from the electrical power supplied through the power coupling device. The electrical power supplied through the power coupling device may be but not limited to being provided by a solar panel 1310. For example, a solar powered RF device, such as a RF repeater 115 that is powered by solar power, may store excess energy provided by the solar panel in the energy storage device 815 which in turn would provide required operational power when the solar panel was not producing enough or any power to the power section 800 (power supply). The power control unit 820 is controlled by the microprocessor 825. The microprocessor 825 may be able to monitor the energy available via the power rectifying circuit 810 and determine how much power each component in the energy sensor 120 is to receive via the power control unit 820. For example, the microprocessor 825 may monitor the energy available via the power rectifying circuit 810 and reduce or eliminate the power distribution to a section such as but not limited to the display 860, measurement section 826 or RF Transciever 875. Internally the microprocessor 825 may use a low power indicator or low power flag to indicate a low or diminishing power supply. This insufficient energy indication may occur when the remaining monitored energy supply passes below a predetermined energy reserve level. The power control unit 820 logic may operate within the microprocessor 825 and depending on the power supply available or power within the energy storage device 815 may simply not operate certain portions of the RF device. Alternatively, the power control unit 820 may contain a microprocessor and be operable to control at least part of the power distribution within the energy sensor 120. For example, a specific portion of the RF device being shut down to conserve power may occur when the power supply from the solar panel and energy storage device 815 falls below a predetermined threshold. The power control unit 820 logic may shut down any outgoing RF transmissions due to the power requirement to make such a transmission and simply store any communication packets within the memory 855. The communication packet would be held in the memory 855 until such time that sufficient power is available to make the RF transmission. These stored packets may consist of packets generated within the microprocessor 825 or communication packets received from another RF device being held for retransmission on the mesh network as a sufficient energy supply or energy reserves is available. If a transmission was received acknowledging that a received packet was either retransmitted using another RF device or acknowledgement from the target device was received, the stored communication packet may no longer be held for transmission.

The measurement section 826 may comprise a measurement-coupling device 830, an analog to digital converter 835, a microphone 840, a camera 845, a digital input 850, and a keypad 865. The measurement-coupling device 830 may be used by the sensor 120 to make an analog measurement of an energy parameter. The A/D 835 converts this energy parameter from an analog signal to a digital signal. The microphone 840 is used to convert a sound recording to an analog signal. The AID 835 may convert this to a digital signal. The microprocessor 825 may be able to store the sound recording in memory 855 and may be able to transmit the information recorded to the energy management station 100 or another RF device. Similarly, the camera 845 may be used to record an image or stream of images that may be stored in the memory 855 and may be transmitted to the energy management station 100 or another device. The digital input 850 couples with the microprocessor 825 and may be used to monitor the status of a switch, a breaker, or to monitor pulses from another metering device such as a flow meter, gas meter or electrical meter. The keypad 865 can be used to switch displays or make a change in the setup of the RF device.

The communication section 858 may comprise a display 860, communication port 870, RF transceiver 875 and RF antenna 880. The microprocessor may use the display 860 to provide information to the user such as measurement parameters, setup information, and measurements. The communication port 870 may contain more than one communication channel. The communication port 870 may be used to drive the IRDA port and in addition another communication port 870 may be coupled with an Ethernet, modem, power line carrier, or serial port. The RF transceiver 875 may be used by the microprocessor 825 to transmit and receive communication packets wirelessly on the RF mesh network. The RF transceiver 875 may be referred to as a communication port or a wireless communication port on the RF device. Alternatively, the RF transceiver 875 may be separated from the energy sensor 120 and may couple with the microprocessor 825 through the communication port 870.

The control section 883 may comprise an analog output 884 and a digital output 885. The analog output 884 may be used to transmit the measurement information via an analog signal to another device or be used to perform a control function such as but not limited to controlling a thermostat. The digital output 885 can be used to transmit the measurement information in the form of pulses or to perform a control action such as but not limited to tripping a breaker, resetting a breaker, turning on an alarm, etc.

The processing section 890 comprises a microprocessor 825 and a memory 855. Some of the tasks the microprocessor 825 is used for include storing and reading data within the memory 855, coordinating the power distribution in the energy sensor 120 via the power control unit 820, creating and reading communication packets, encoding and decoding the communication packets for the wireless network, and reading measurement via the A/D 835. The microprocessor 825 may interface between the RF Transceiver 875 and at least one of the communication channels on the communication port 870. The microprocessor may be used to convert between the protocol and communication packet on the wireless mesh network and compatible protocol and communication packet to communication to any device on the other communication port.

The microprocessor 825 may be operable to perform energy calculations at a metering point and store the energy values in the memory 855. In addition, it may be able to control the power distribution within the energy sensor 120 through the power control unit 820. In addition the microprocessor is able to encode and decode the communication packets sent over the RF transceiver 875.

The energy sensor 120 may be able to monitor other meters, such as a water, air, gas, electric or steam meters, via the digital input or an analog sensor used as the measurement coupling device 830 and wirelessly transmit the data to another RF device or the energy management station 100.

Referring to FIG. 8b, the measurement-coupling device 830 doubles as a power-coupling device 805. For example, the energy sensor 120 may incorporate a non-intrusive CT and be used to monitor electrical current in a non-intrusive manner such as the electrical energy sensor 900 shown in FIG. 9. The current induced in the measurement-coupling device 830 (non-intrusive CT) may be switched to the power rectifying circuit 810 or the analog to digital converter by a switch 895. Typically, when a measurement is being taken, the output of the measurement-coupling device 830 is switched by the microprocessor 825 to the analog to digital converter 835 to reduce the CT burden of the energy sensor 120, during this time, the energy sensor 120 is powered from the energy storage device 815 otherwise the current is switched to the power rectifying circuit 810. The energy sensor 120 is able to measure the current flowing through the conductor 903 that passes through the center of the energy sensor 120.

Figure 9A:
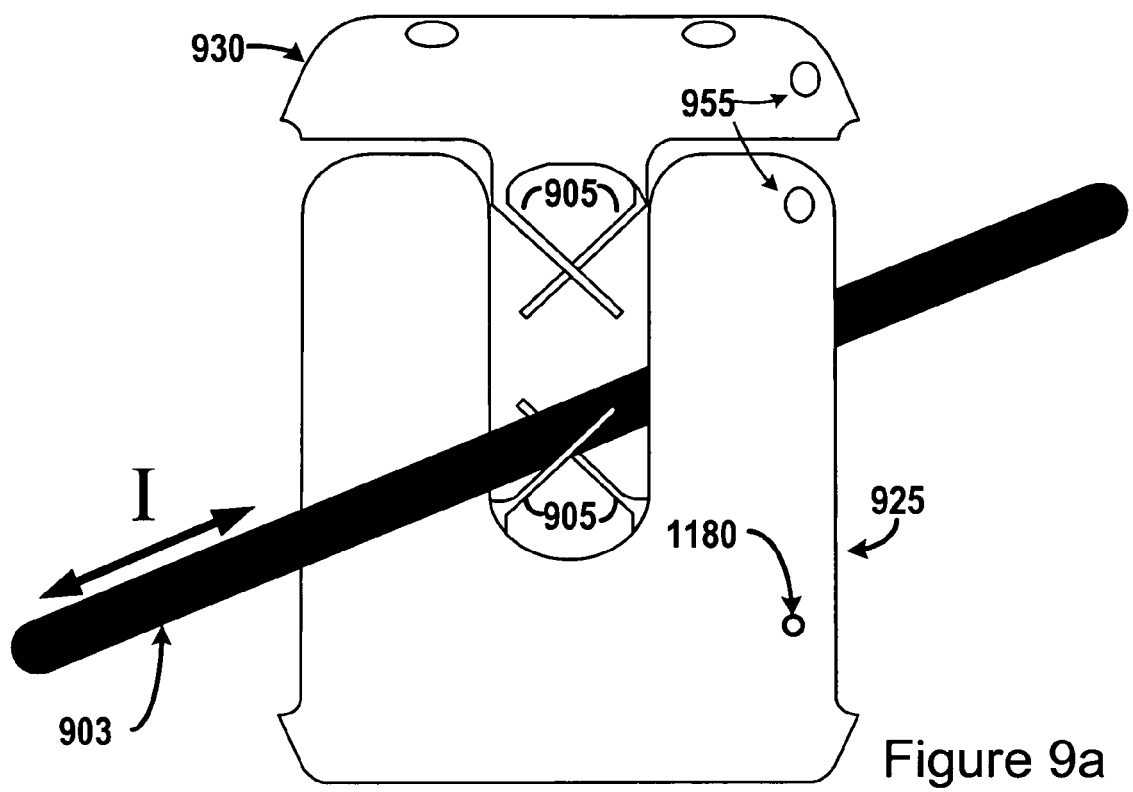
FIG. 9a depicts an installation method for an electrical energy sensor onto a current carrying wire.
Figure 9B:
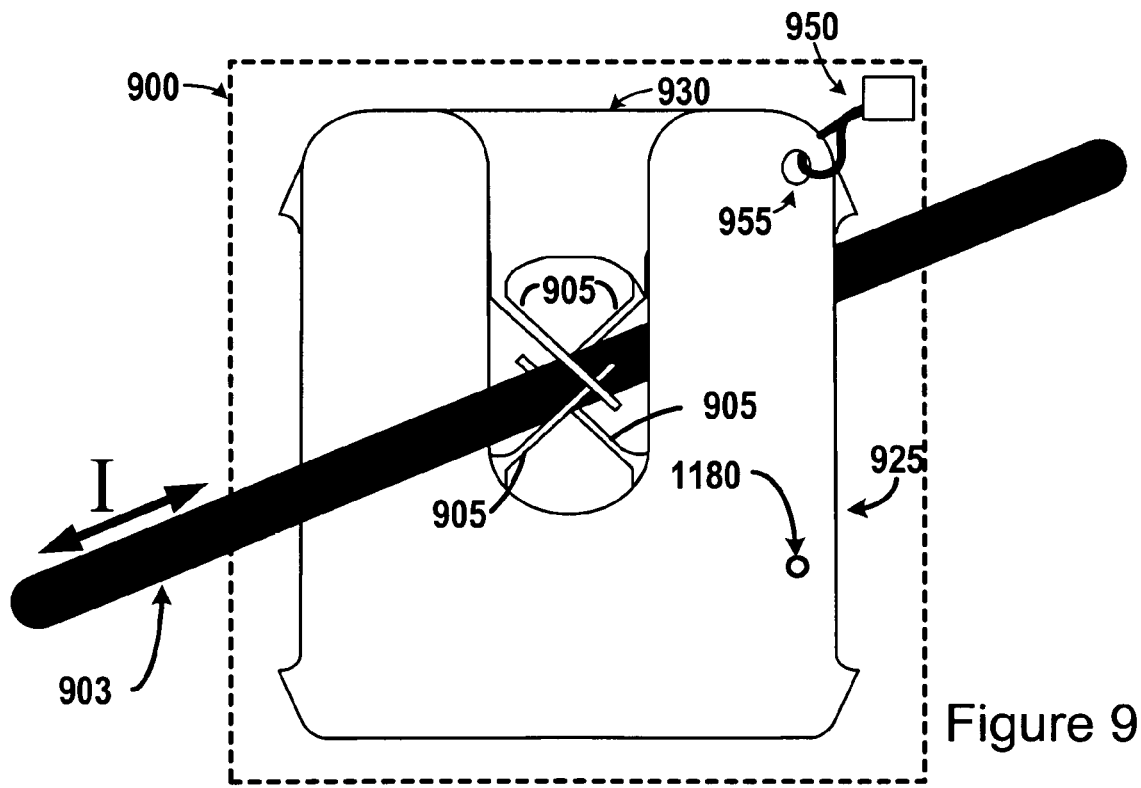
FIG. 9b depicts an installation method for an electrical energy sensor onto a current carrying wire.
Figure 9C:
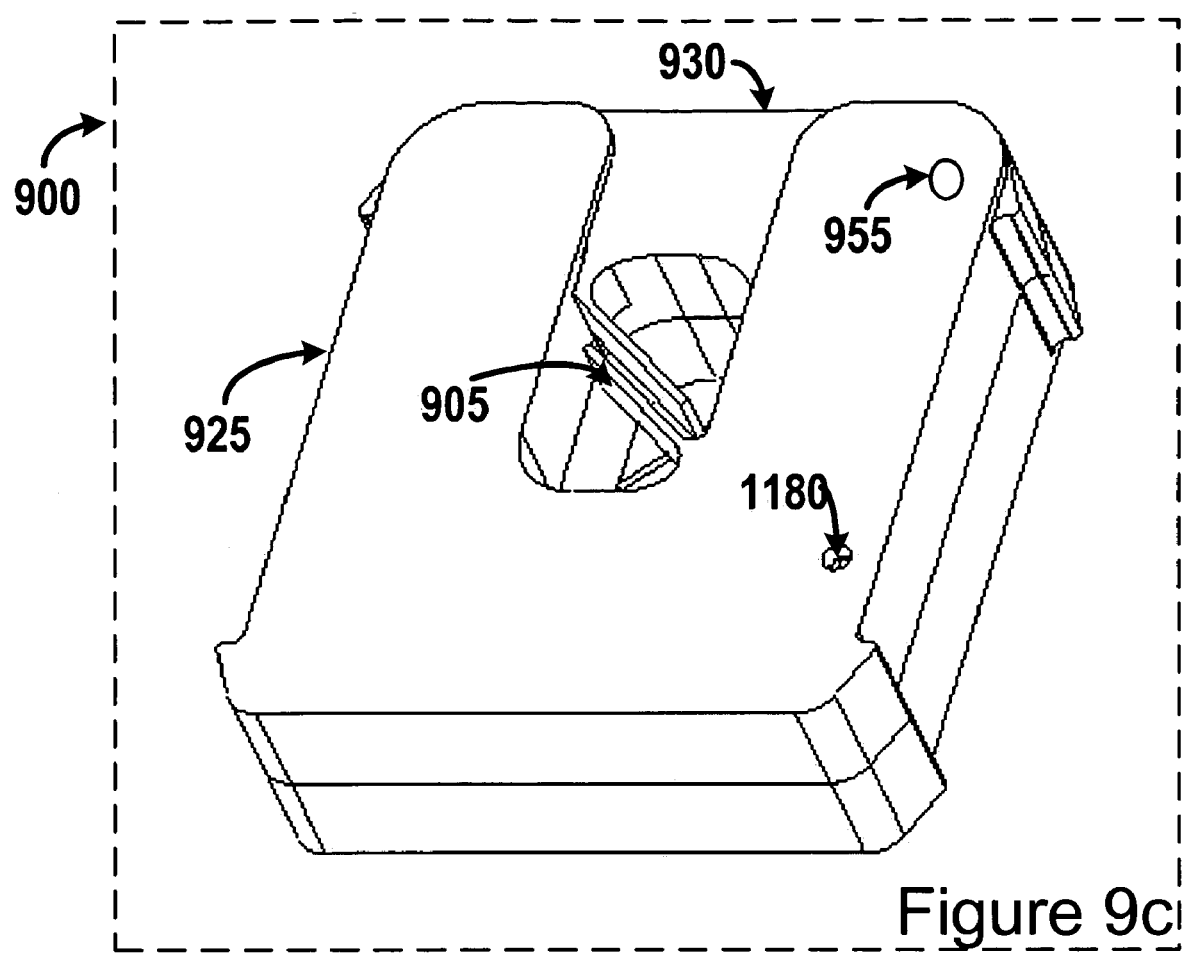
FIG. 9c depicts an installation method for an electrical energy sensor onto a current carrying wire.

As shown in FIG. 9a, the current carrying wire 903 is held in place by the tabs 905 effectively holding the sensor to the current carrying wire 903. The electrical energy sensor 900 embodiment of energy sensor 120 may contain two main separable pieces, section 925 and section 930. The section 925 may contain all the electronics as well as a large portion of the non-intrusive CT; however, it is possible for both sections to contain the electronics. The remaining section 930 can be removed so that the electrical energy sensor 900 can be placed around the current carrying wire 903 at which time the section 930 is connected to the section 925 which in combination comprises a CT core around the current carrying wire 903. FIG. 9c depicts a perspective view of the energy sensor 120 in the non-intrusive CT embodiment.

The energy sensor 120 may incorporate a non-intrusive CT. This allows simple and inexpensive installation comprising separating the non-intrusive CT, slipping it over the current carrying wire 903 or fuse, and reconnected to form a CT core around the wire or fuse. The non-intrusive CT may incorporate the sensor microprocessor and the wireless communication hardware. FIG. 9a and FIG. 9b depict an electrical energy sensor 900 comprised of sections 925 and 930 separated with the current carrying wire 903 put inside the 925 section of the electrical energy sensor 900. An electrical energy sensor 900 is an embodiment of the energy sensor 120 used for monitoring electrical energy parameters. As shown in FIG. 9b, the section 930 is coupled with section 925 to form a non-intrusive CT sensor. The electromagnetic field generated by the current carrying wire 903 is captured by the CT and may be used to power the microprocessor in addition to allowing the current carried by the wire to be measured. The electrical energy sensor 900 may incorporate tabs 905 that may be bent when installing the sensor over a wire or a fuse. These plastic tabs are then able to hold onto the wire or fuse due to the friction and pressure created by inserting the wire into the electrical energy sensor 900. As the electrical energy sensor 900 is able to hold its location on the current carrying wire 903 or fuse, it is not required to mount the sensor to any location in the cabinet. In cases where it is desired to monitor two or more phases of current, the electrical energy sensors 900 may have wires that extend from them to one or more other non-intrusive CTs. Alternatively two or more separate electrical energy sensors 900 may be used where these two or more electrical energy sensors 900 communicate their reading wirelessly to a master electrical energy sensor 900 or alternatively to the energy management station or an additional RF device. It is possible for the master electrical energy sensor 900, additional RF device, or the energy management station 100 to correlate these two or more readings.

Alternatively the form factor depicted in FIGS. 9a and 9b may be used for a RF repeater 115 or RF repeater converter 110. This form factor may allow for an easy method for extending the RF mesh network, as the form factor is able to draw power from the magnetic fields generated by the current carrying wire 903. This may allow for network range extension over large distances by installing this form factor RF repeater 115 or other RF device over electrical distribution wires. Alternatively, these RF repeaters may be able to act as RF repeaters 115 for communication, packets and frequencies from other RF systems. Some examples of these RF communications from other RF systems may include but not be limited to cell phone frequencies, wireless Ethernet connections, and other radio frequency transmissions. Alternatively, a RF repeater converter 110 may be used in this form factor to detect power line carrier on the wire and be able to boost the signal, repeat the signal or convert the power line carrier to another communication medium such as the wireless mesh network.

The RF devices may have a configurable setting that can indirectly determine what average power is required for the device to perform. For example on the energy sensors 120, the user is able to modify sleep, transmit, and sample intervals. For instance, if the sample interval is increased from say a sample every 30 seconds to a sample every 1 minute, the energy sensor 120 is only required to take one reading each minute instead of two readings per minute which may reduce the power required to run the energy sensor 120. This reduction in power may increase the battery life of an energy sensor 120 that relies on battery power. In addition, it may increase the ride through time of the energy sensor 120 if power supplied to the device were insufficient or removed. Further by modifying the transmit interval on an energy sensor 120, the data the energy sensor 120 collected may be stored in the energy sensor 120 and only sent at a specific interval in order to send more data in each communication data packet but be able to transmit the data less often. For example, an energy sensor 120 that samples each minute may only transmit each hour thus significantly reducing the overall power required within an hour to transmit versus an energy sensor 120 that transmits sixty times in an hour. Likewise, a RF repeater 115 or RF repeater converter 110 may queue received communication data packets until a specified time interval or timeout has expired when all the data may be transmitted in one transmission. In addition, the RF devices may queue data until sufficient power is stored to allow transmission of the data and continued operation. The data queued within a RF device may be stored within non-volatile memory such that it is not lost due to a power failure. Alternatively, the data may be transferred into non-volatile memory before a power failure on the RF device.

Referring to FIG. 9a, the electrical energy sensors 120 may indicate the direction of energy flow in the wire 903. The direction of energy flow is calculated from the phase of the current in the wire 903 detected with the current CT and the phase of the voltage detected with a capacitive voltage detector or a voltage lead 275. The energy flow through the energy sensor 120 may be used to indicate a supply or load of electrical energy through a metering point. A quick indication may be performed using two different color LEDs. For example, a red LED may indicate that the energy flow detected on the wire 903 corresponds to a generation or supply of power and the green LED corresponds to a load or demand of electrical power. The installer or commissioner of the energy sensor 120 may be able to determine if the electrical energy sensor 500 is connected in the correct orientation on a wire 903. For example, if the energy sensor 120 is connected to a metering point that should register as a load and the LED illuminates indicating a supply or generation of power, the installer may reinstall the electrical energy sensor 120 in the opposite orientation so that the flow of energy flows in the opposite direction through the electrical energy sensor 500. Alternatively a single LED may be used to indicate energy flow direction through the electrical energy sensor 120. This single LED may be able to indicate two different colors or simply indicate one of the two energy flow directions if illuminated and the opposite energy flow direction if not illuminated.

The electrical energy sensor 900 may be able to use a specified voltage and power factor to calculate energy and power information from the current readings of the electrical energy sensor 900. An electrician may specify the voltage and power factor. Alternatively the power factor may be able to be determined using a voltage phase detection with a capacitive voltage detector as described above. Alternatively, voltage may be provided to the electrical energy sensor 900 from another IED device that may be monitoring voltage at another location where the voltage in the wire can be derived. This may be calculated by using a known voltage on another bus and the PT ratio or electronic equipment used to couple the two electrical busses together. Alternatively, the calculations for power factor, voltage, energy, and power may be done in the other RF devices such as the RF display device 140. Alternatively the handheld device 635 or the energy management station 100 may be used.

FIG. 9 depicts a revenue locking mechanism 950. This revenue locking mechanism 950 comprises of a hole within the section 925 and a corresponding hole within the section 930 as well as a revenue lock tab. When section 925 and section 930 are joined together forming an enclosure around the conductor 903, a revenue locking tab may be passed through the opening such that if the enclosure formed by section 925 and section 930 were to be broken, the revenue locking tab would have to break. This provides a means of detecting tampering with a energy sensor used for revenue energy monitoring. If a voltage sensor, corresponding to the current transformer with a revenue lock, were removed, the energy sensor may be able to use a specified voltage and power factor to calculate the energy and power information for revenue purposes. The specified voltage and power factor may be derived from past voltage and power factor readings and profiles from before the voltage was disconnected from the energy sensor 120.

The energy management station 100 may be able to perform an upgrade on an RF device over a wireless link. Preferably this wireless link is an RF mesh network and at least one routing path may exist between the RF device and the energy management station 100. Alternatively, a portion of the communication path may be an alternate communication medium such as an Ethernet connection. In addition, if more than one routing path exists to the RF device, it may be possible for a faster communication rate and thereby may allow a faster firmware upgrade to the device. The RF devices may be able to signal to the energy management station 100 if they have sufficient backup power for a firmware upgrade in the event that an external power supply fails.

Figure 10:
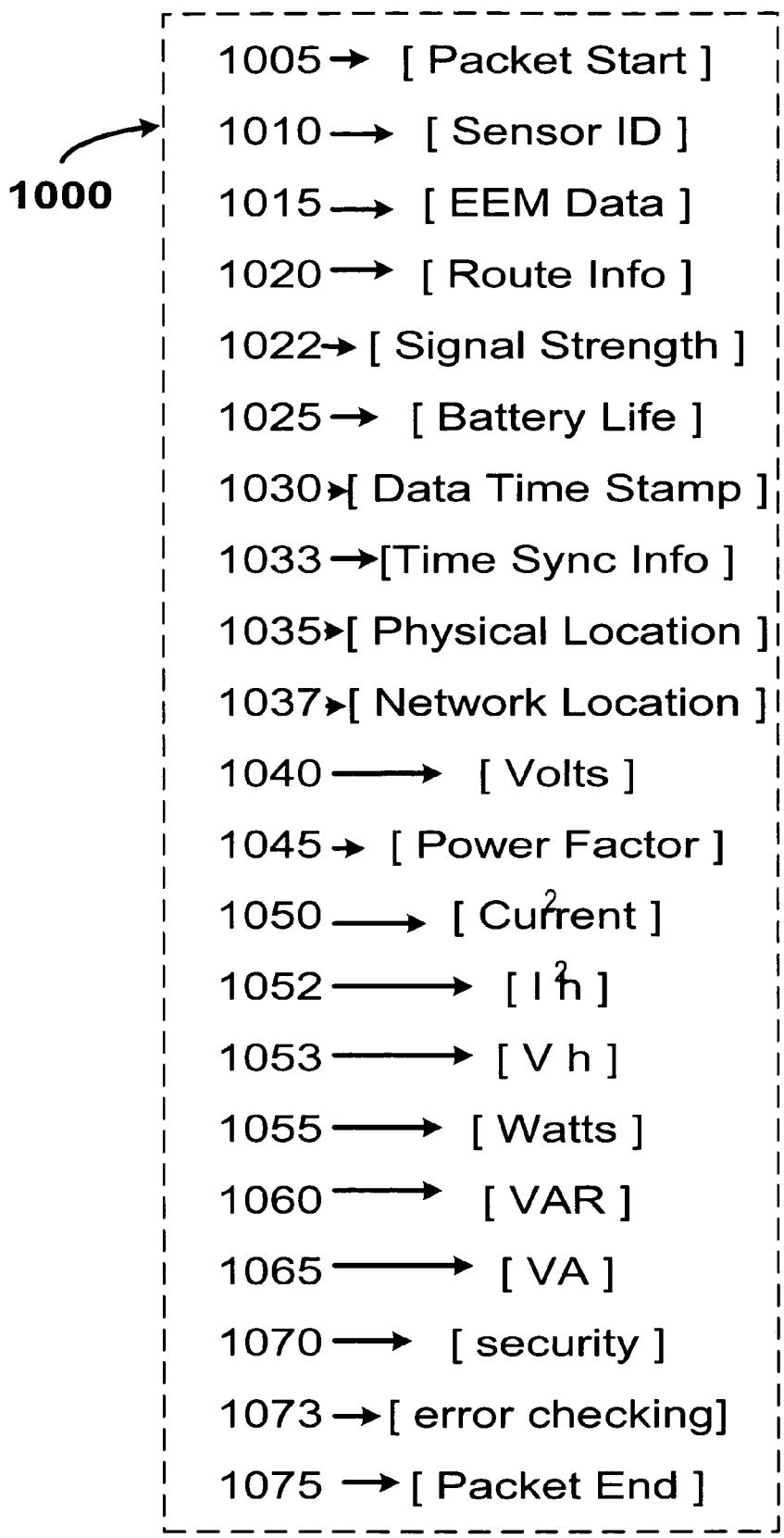
FIG. 10 depicts some of the general components within an RF data communication packet payload.

The microprocessor in the energy sensor 120, RF devices, and the energy management station 100 may assemble the RF communication data packets 1000. In addition the microprocessor 825 in the energy sensor 120 may be able to calculate energy parameters as well as construct, encode and decode RF communication data packets 1000. This RF communication data packet 1000 may be optimized for efficient, high speed, low collision communications. In addition, the communication data packet 1000 may be highly flexible in that it may contain only a few energy parameters to a large amount of energy parameters and from only a few pieces of routing information to a large amount of routing information. As shown in FIG. 10, some of the information that may be contained within the RF wireless payload includes a packet start marker 1005 or preamble, sensor ID 1010, EEM data 1015, routing information 1020, signal strength 1022, battery life 1025, data time stamp 1030, time sync information 1033, physical location 1035, energy distribution metering location 1037, volts 1040, power factor 1045, current 1050, $I^2R$ 1052, $V^2h$ 1053, watts 1055, VAR 1060, VA 1065, public security key 1070 error codes 1073 and a packet end marker 1075. For example, the battery life 1025 may be used to indicate if power reserves in the energy storage device is lower than a certain predetermined threshold. The battery life 1025 or low power indication may indicate the RF device is currently in a low power mode or may soon be emerging a low power mode. This may indicates to the energy management system 100 or other RF devices on the mesh network that a certain mesh path or certain RF devices may be temporarily inaccessible. This low power indication may be referred to as a low power flag.

The error codes 1073 may at least partially comprise of a cyclic redundancy error checking code or a forward error correction code. The forward error correction may be used by the receiving RF device or energy management station 100 to correct information in the data packet that may have been corrupted during transport. Using forward error correction may increase the wireless mesh network range, decrease the required RF antenna, decrease the transmit power required at each RF device and assist in any corruption of the data packet occurring during transport such as transport over long distances or outside of a partial RF shield.

For example, the microprocessor 825 or RF transceiver 875 may generate a forward error correction code for at least a portion of the communication packet where the forward error correction code is incorporated within the communication packet. Each RF device participating in the path that the wireless mesh communication packet 1000 may analyze the communication packet using the error codes 1073 provided in the communication packet. Where the error codes 1073 comprise forward error correction codes, each RF device may be operable perform correction on the message sent within the communication packet 1000. This correction may incorporate one or more digital bits or streams of bits. If correction cannot be performed due to excessive error, the intermediate RF device or target RF device may send a message to the source of the message requesting retransmission. Alternatively, if forward error correction code is not used but an error detection code as the error codes 1073, on detection of error, either at the intermediate or target RF device, a message may be sent to the source RF device to retransmit the information.

Forward error correction ("FEC") is an error control system for data wherein the receiving device has the capability to detect and correct any character or code block that contains fewer than a predetermined number of symbols in error. FEC obtains error control in a data transmission in which the source RF device sends redundant data and the destination RF device recognizes only the portion of the data that contains no apparent errors. FEC is accomplished by adding bits to each transmitted character or code block, using a predetermined algorithm. A simple example of a FEC code is to send the digital bits of information three times and use a majority vote to determine the original message. For example, sending 111

001 000 110 would be received as 1001. In addition, a cyclic redundancy error checking code ("CRC") may be incorporated to ensure the correct message was received. Of course, this type of FEC code is not efficient and while able to be implemented on a mesh RF device would not be as practical due to possible bandwidth limitations with using mesh. More efficient FEC codes may be used within a wireless network. For example, using Reed-Solomon codes on communication packets send over a mesh based wireless network has a minimal impact on bandwidth and efficiency of the network and as it deals with groups of bits, such as bytes, it is able to deal with burst errors such as 6 consecutive bits in error. For example, a double error correcting version of a Reed-Solomon code can provides a comfortable safety factor on current implementations of Reed-Solomon FEC in compact disc technology where this technology is able to deal with error bursts as long as 4000 consecutive bits.

Using the above Reed-Solomon codes example, a message of "m" length can cope with up to "s" errors as long as the message length "m" is strictly less than N−2s where N is the number of elements in the group of bits. Using a grouping of 8 bits (byte) there are $2^8$ elements or 256 elements therefore to correct up to 3 errors in the message The message length that can be protected is less than 256−2*3 or 249 bits of message within a 256 bit communication packet. This means a message length of 249 bits could have up to 3 bits corrected by incorporating an additional 6 bits to the message. Any additional bits computed by the processor 825 and added to the communication packet may offer error correcting capability to the intended message. Alternatively, a number of known forward error correcting codes could be used within the mesh network. The reliability, throughput, and latency may be improved using a forward error correction codes.

The RF devices may be able to intelligently assemble the information in each packet so as not to include redundant or unnecessary information within the RF payload. A RF device or energy management station 100 may assemble a communication data packet 1000 to be used as a timesync for another RF device or energy management station 100. An RF device or energy management station 100 receiving or processing the communication packet 1000 containing the timesync, may be able to adjust its time to correspond to the timesync sent in the communication packet. The timesyncing process may account for any packet decoding delays and speed of communications. The communication packet 1000 may be digitally signed and may use a private key and public key signing system. Alternatively the communication packet 1000 may be digitally encrypted and may use a private key and public key exchange between two or more RF devices including the energy management station 100.

Figure 11:
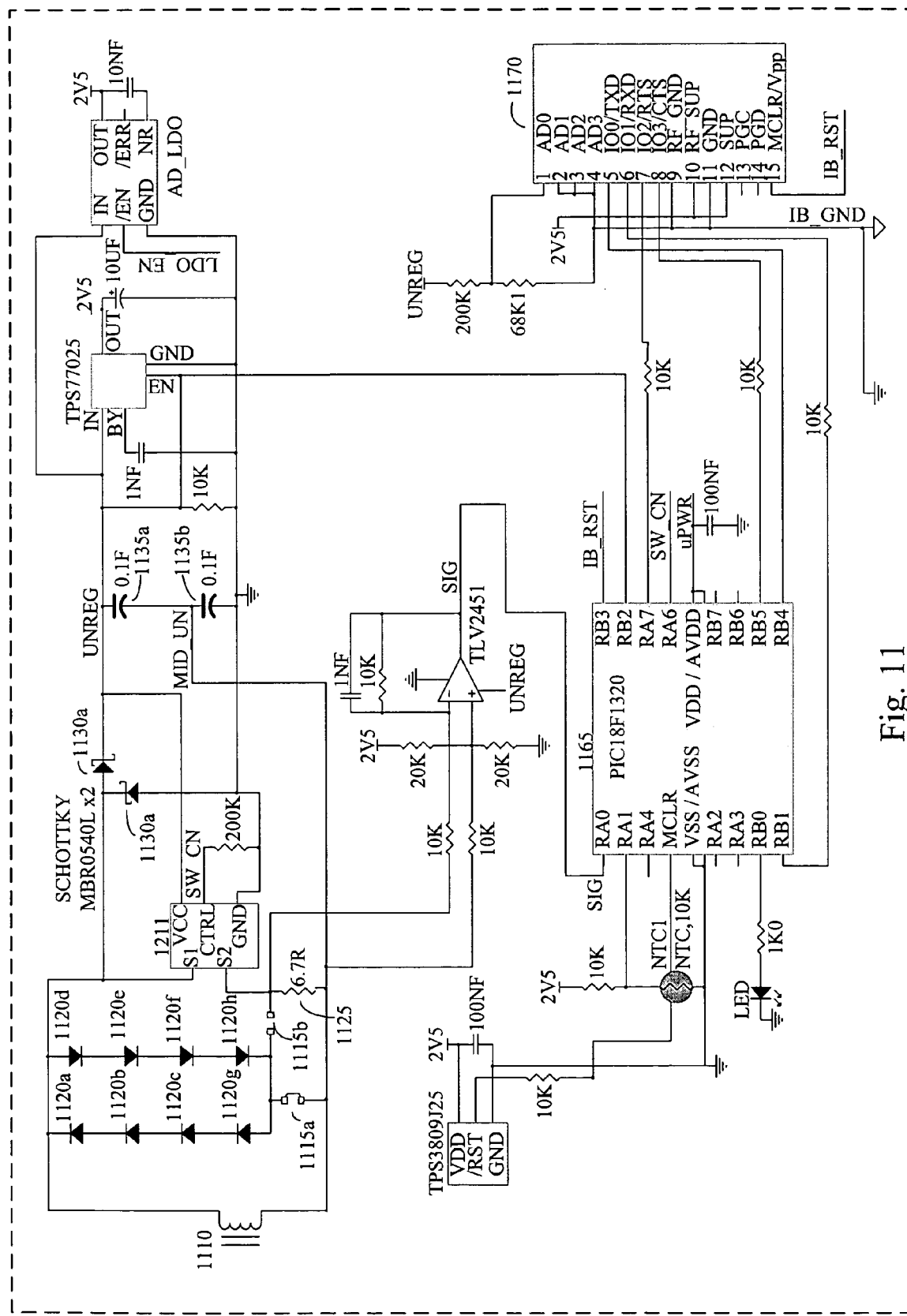
FIG. 11 schematically illustrates an embodiment of a wireless electrical energy sensor.

Referring now to FIG. 11 a schematic diagram 1100 of an example of the wireless current sensor is shown. The wireless current sensor is an example of the electrical energy meter 900 that measures at least one power parameter, such as RMS current, flowing through a current transformer (CT) 1110. The CT 1110 may be of solid or split core construction and may be manufactured from silicon steel laminations. The calculation of the power parameter is done within a microprocessor 1165 such as the model PIC18F1320 manufactured by Microchip Technology of Chandler Ariz. The power parameter is communicated over the wireless mesh network by Endpoint 1170. The endpoint may be the model i-Bean 9000 manufactured by Millennial.Net located in Cambridge Mass. CT 1110 may be wound with 1900 turns of 32 gauge magnet wire and operate over a range of approximately 15 to 125 Amps of primary current.

During normal operation, the circuitry of the wireless current sensor is self powered. The voltage across the secondary of the CT 1110 is clamped by diodes 1120a, 1120b, 1120c, 1120d, 1120e, and 1120f. This voltage peaks at a voltage equal to 3 diode drops or about 2.1 volts, but is dependent on the amount of primary current flowing through the CT as the voltage drop across the diodes is dependent on the amount of current flowing through them. The combination of Schottky diodes 1130a and 1130b and capacitors 1135a and 1135b form a voltage doubler and produce unregulated DC for input to low dropout regulator 1140. When in this mode of operation, the capacitors 1135a and 1135b are being charged by the secondary current of the CT 1110. Capacitors 1135a and 1135b may be the model PB-5R0V104 manufactured by Cooper Electronic Technologies PowerStor Products Division located in Dublin Calif.

When in measuring operation, a CMOS analog switch 1121 is turned on by the microprocessor 1165 through the SW_CN line. This causes the secondary current of the CT 1110 to flow through the switch 1121 and resistor 1125 instead of the diodes 1120. The voltage drop across the resistor 1125 is then amplified or buffered through op-amp 1150 and applied to an analog to digital input of microprocessor 1165. The microprocessor 1165 may then sample this voltage and calculate at least one power parameter. In one example resistor 1155 is supplied and the op-amp 1150 forms a differential amplifier of the voltage across resistor 1125. It will be noted that in this configuration, only the positive half cycles of the CT 1110 secondary current will be measurable due to the op-amp being unable to output a negative voltage due to the lack of a negative rail. In a second example, resistor 1155 is not supplied and the output of op-amp 1150 is a full representation of the voltage drop across resistor 1125 offset by a DC voltage equal to the DC voltage at the connection point of capacitors 1135a and 1135b. During the measuring operation, the microprocessor 1165 may turn off linear regulator 1140 using an I/O line connected to the enable pin of the linear regulator 1140.

It will also be noted that only one of jumper 1115a or 1115b is intended to be mounted. If jumper 1115b is mounted, the secondary current of the CT 1110 will flow through resistor 1125 whether the switch 1121 is on or off. This will increase the variability in voltage applied to Schottky diodes 1130a and 1130b due to the additional voltage drop across the resistor. Alternately jumper 1115a can be mounted. In this configuration the secondary current of CT 1110 flows primarily through resistor 1125 when the switch 1121 is on. This has the advantage of less variability in voltage applied to the Schottky diodes 1130a and 1130b, but may introduce errors as the voltage across resistor 1125 increases due to the leakage of diodes 1120.

Voltage detector 1160 may provide a reset signal to microprocessor 1165 on initial power-up. LED 1180 provides an indication to the user of correct operation of the device. Voltage detector 1160 may be the model TPS3809J25, op-amp 1150 may be the model TLV2451 and linear regulator 1140 may be the model TPS77025 all manufactured by Texas Instruments in Dallas Tex. Resistor 1145 ensures that the voltage regulator 1140 is enabled on initial power-up. Resistor 1185 ensures that the switch 1121 is off on initial power-up.

Microprocessor 1165 renders the calculated power parameter value as an analog signal by outputting a pulse width modulation (PWM) signal on an I/O line. This PWM signal passes through the filter composed of resistor 1176 and capacitor 1178 to provide an analog signal to Endpoint 1170. The Endpoint 1170 transmits the power parameter over the mesh network. The endpoint also samples an analog signal created by the resistor divider formed by resistors 1172 and 1174. This is signal is indicative of the unregulated voltage and the DC value of this signal may also be transmitted over the mesh network. Alternatively, the microprocessor 1165 may send the data or an RF wireless communication packet 1000 to the endpoint 1170.

Figure 12:
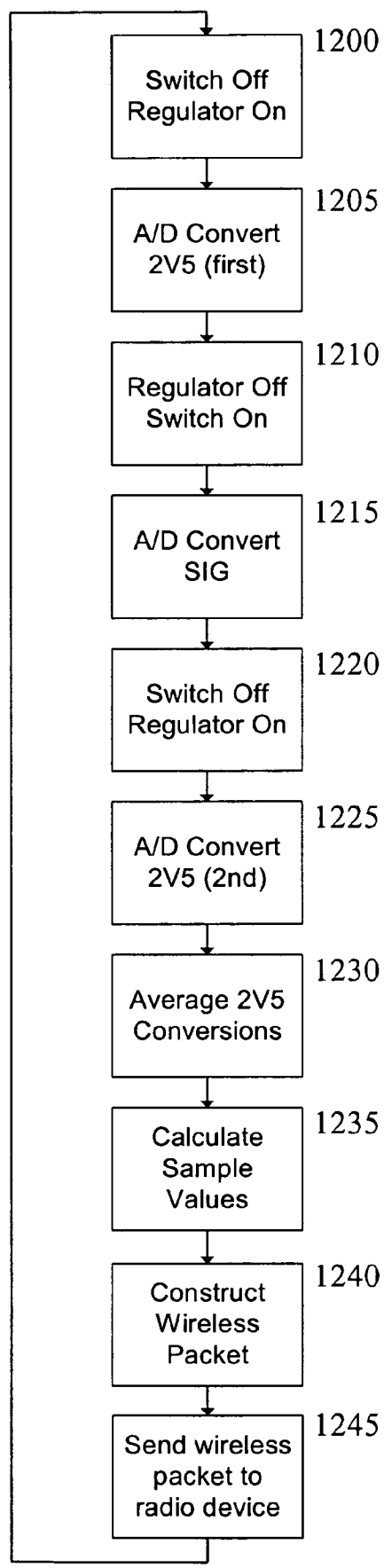
FIG. 12 depicts a flow diagram of the operation of the microprocessor calculating a power parameter.

Referring now to FIG. 12, the operation of the microprocessor 1165 with regard to calculating the power parameter is shown. Initially, switch 1121 is switched off and regulator 1140 is switched on (block 1200). The A/D converter inside the microprocessor 1165 converts the voltage on the 2.5V line (block 1205). It will be noted that this conversion is with respect to the unregulated voltage being used to supply the microprocessor. The regulator 1140 is then turned off and the switch 1121 is turned on (block 1210). The microprocessor 1165 then converts the voltage from op-amp 1150 at least once (block 1215). This conversion is also with respect to the unregulated voltage. The switch is once again turned off and the regulator is turned on (block 1220). A second conversion of the 2.5V line may be made (block 1225). If more than one conversion of the 2.5V line was made an average may be calculated (block 1230). At block 1235 the following calculation is made for each sample of the op-amp 1150 voltage in order to compensate for the fact that the conversions were made with respect to an unregulated voltage:

$$\text{comp\_samp} = \frac{\text{SIG\_Samp}}{2.5\text{V\_Samp}} * FS.$$

Where comp_samp is the compensated sample value, SIG_Samp is the actual A/D conversion result value for the voltage from op-amp 1150 and 2.5V_Samp is the actual conversion result value for the voltage on the 2.5V line from voltage regulator 1140. It can be seen that this calculation increases the effective number of bits used for the conversion of the op-amp voltage output at lower values of the unregulated voltage due to the fact that all conversions are made with respect to the unregulated voltage. At block 1240 the microprocessor may at least partially construct a RF communication data packet 1000 and at block 1245 this RF communication data packet 1000 may be sent to a radio device. The voltage regulator is powered only when needed for the conversion process or when transmission over the RF network is necessary, thus reducing total power consumption. The lower the power consumption, the lower the minimum primary current required to operate the circuitry. It is also noted that if the unregulated voltage remains relatively constant throughout the conversion process, accuracy will be comparable to using a fixed reference for the A/D converter.

Figure 13A:
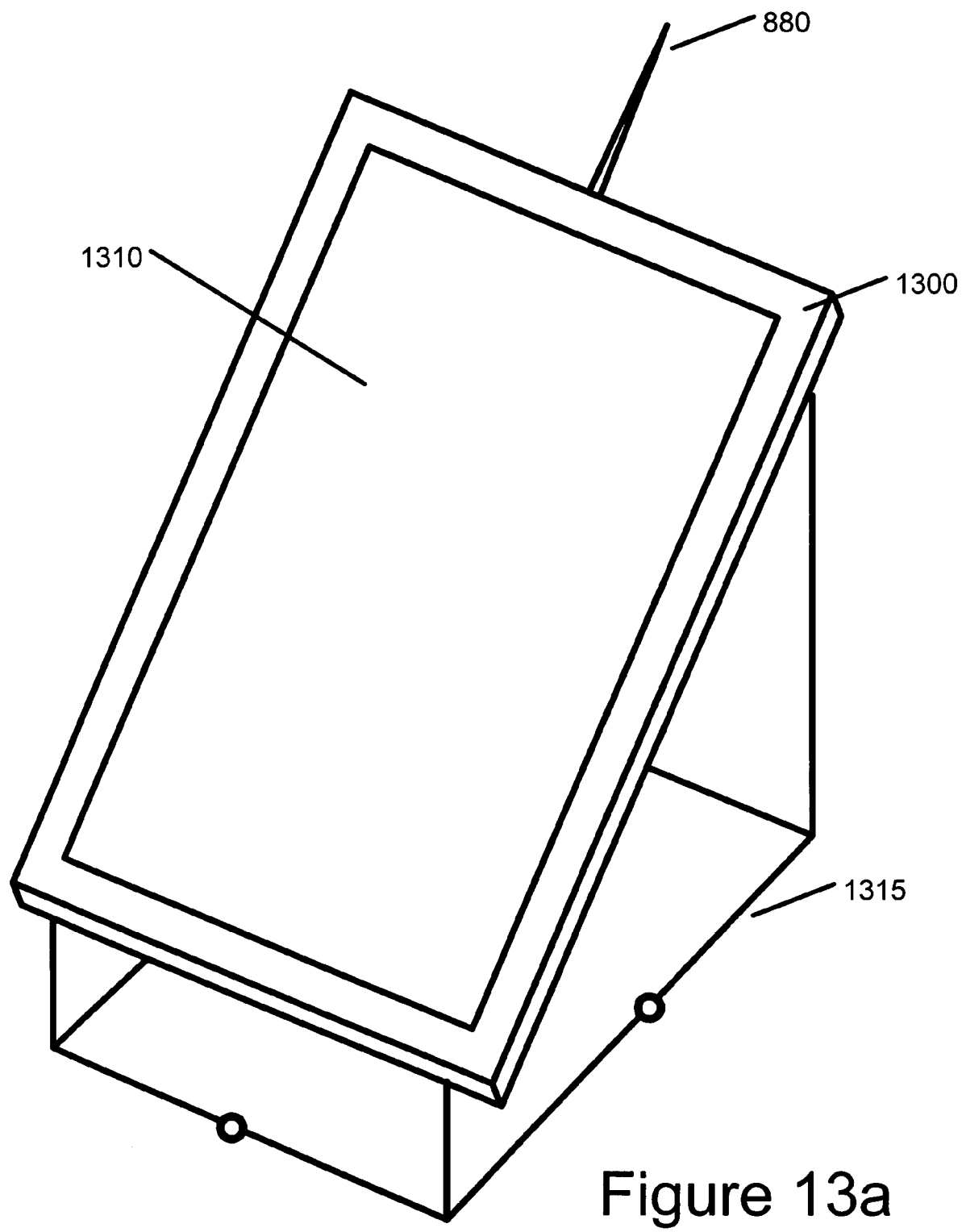
FIG. 13a depicts an embodiment of a RF device that is solar powered.

Referring now to FIG. 13*a*, an example of an RF device that is solar powered is shown. The solar powered RF device 1300 is shown may be used to extend a wireless mesh network where it is inconvenient to connect to a traditional power source. The solar panel 1310 is operative to generate electrical power from a light source. For example, this light source may be the sun or artificial light sources such as fluorescent, incandescent, CCFL, LED lights, or any other source of light. The FIG. 13*a* indicates that the solar panel 1310 is attached to the solar powered RF device 1300. Alternatively the solar panel 1310 may be detached from the solar powered RF device 1300 and mounted elsewhere.

The solar powered RF device 1300 may be mounted through use of a stand 1315 such that the device is angled so not to accumulate precipitation if exposed to weather elements. In addition, the angle may benefit the collection of light.

Figure 13B:
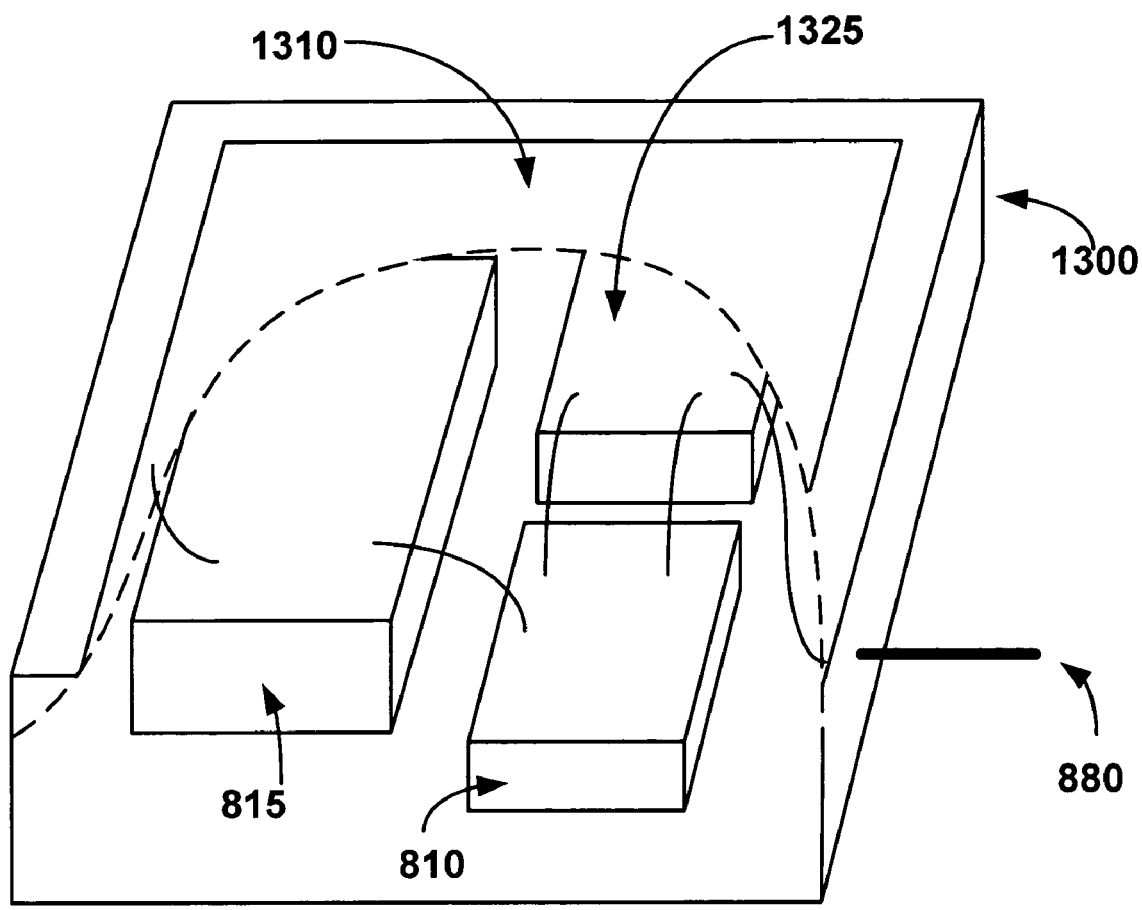
FIG. 13b depicts some of the general components within an embodiment of a solar powered RF device; and, FIG. 13c depicts a block diagram of an embodiment of a solar powered RF device.
Figure 13C:
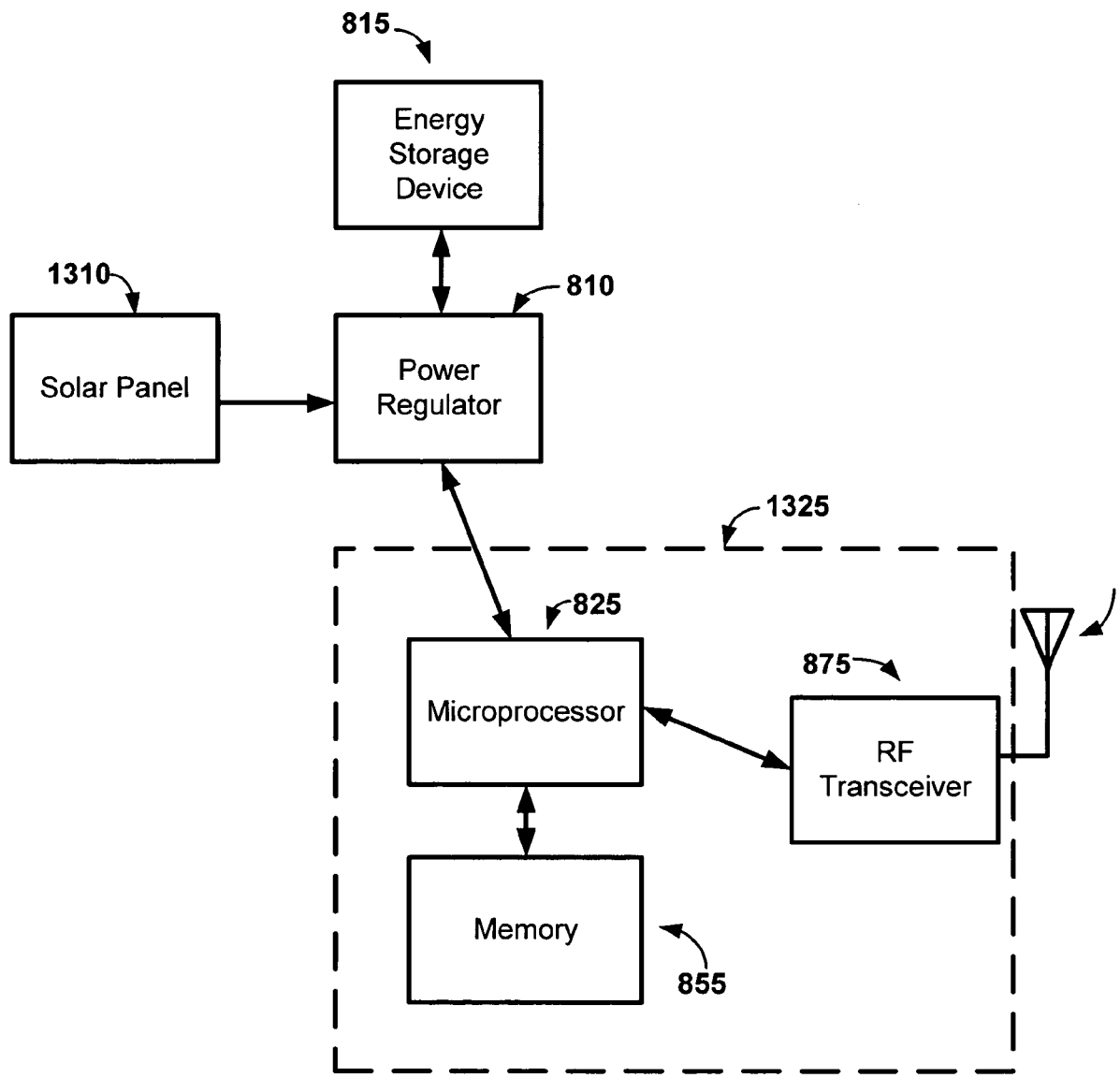

Referring now to FIG. 13*b*, a cutaway view of the solar powered RF device 1300 is shown and FIG. 13*c*, a block diagram of interconnections within the solar powered RF device is shown. This view shows an embodiment of an energy storage device 815. This energy storage device 815 may be a rechargeable battery. A power rectifying circuit 810 is shown connected to the solar panel 1310. The power rectifying circuit 810 may be used to supply excess electrical power from the solar panel 1310 to store an electric charge the energy storage device 815 and to provide control power to the mesh component 1325. In the case that insufficient control power is provided from the solar panel 1310, the power rectifying circuit 810 would use the electric charge stored on the energy storage device 815 to supply sufficient control power to the mesh component 1325. The mesh component 1325 may consist but not limited to a microprocessor 825, memory 855, and RF transceiver 875. The solar powered RF device 1300 may further comprise of any of the blocks described within the RF device and indicated within FIG. 8*a* and FIG. 8*b*. The microprocessor 825 is able to monitor the amount of energy stored in the energy storage device 815. This monitoring may be operative through a coupling with the power rectifying circuit 810. The mesh component 1325 is coupled with an antenna 880 and operative to receive communication packets from RF devices and retransmit these communication packets over the mesh network.

It is therefore intended that the foregoing detailed description be regarded as illustrative rather than limiting, and that it be understood that it is the following claims, including all equivalents, that are intended to define the spirit and scope of this invention.

We claim:

1. A system for measuring the delivery of energy from an energy supplier to a consumer through an energy distribution system, said system comprising:
    a first energy sensor configured to measure a first energy parameter of an energy distribution system, said first energy sensor further configured to wirelessly transmit and receive a plurality of communication packets that are selectively configurable by said first energy sensor to include energy data representative of said first energy parameter;
    a second energy sensor configured to be in wireless communication with said first energy sensor, said second energy sensor configured to measure a second energy parameter of said energy distribution system, said second energy sensor further configured to wirelessly transmit and receive said communication packets, and selectively include energy data representative of said second energy parameter sensed by said second energy sensor in said communication packets;
    a radio frequency repeater configured to be in wireless communication with said second energy sensor but out of range for wireless communication with said first energy sensor;
    said first and second energy sensors comprising an adjustable radio frequency transmission power, said first energy sensor further configured to automatically adjust said adjustable radio frequency transmission power to enable wireless communication with said second energy sensor, but he out of range for wireless communication with said radio frequency repeater, and
    said second energy sensor is further configured to automatically adjust said adjustable radio frequency transmission power to wirelessly pass communication packets being transmitted wirelessly between said first energy sensor and said radio frequency repeater.

2. The system of claim 1 wherein said radio frequency repeater comprises a wireless transceiver configured to wirelessly transmit communication packets to said second energy sensor and said wireless transceiver is further configured to receive communication packets from said second energy sensor.

3. The system of claim 1 wherein said radio frequency repeater is configured to wirelessly transmit communication packets to said second energy sensor that are destined for said first energy sensor, and, said radio frequency repeater is further configured to receive communication packets from said second energy sensor that were transmitted from said first energy senor.

4. The system of claim 1 wherein said radio frequency repeater is operative to wirelessly retransmit said communication packets to another radio frequency device.

5. The system of claim 1 wherein said first and second energy sensors each comprise at least one measurement coupling device configured to he coupled with said energy distribution system and operative to sense at least one energy parameter in said energy distribution system, said first and second energy sensors each configured to generate said energy data therefrom.

6. The system of claim 1 wherein said first energy sensor comprises a first communication port configured to wireless transmit said communication packets and a second communication port in communication with said first communication port, wherein said second communication port is configured to be in wired communication with at least one intelligent electronic device.

7. The system of claim 6 wherein said first energy sensor further comprises a processor configured to direct transmission and receipt of messages between said first communication port and said second communication port.

8. A system for measuring the delivery of energy from an energy supplier to a consumer through an energy distribution system, said system comprising:
  a wireless network;
  at least a first energy sensor and a second energy sensor coupled with said wireless network, said first and second energy sensors operative to transmit and receive a communication packet over said wireless network wherein said communication packet comprises energy data representative of at least one energy parameter of said energy distribution system;
  a radio frequency repeater coupled with said wireless network, said radio frequency repeater comprising:
  a communication port operative to wirelessly transmit and receive said communication packet over said wireless network; and
  a processor operatively coupled with said communication port;
  said first energy sensor comprising a radio frequency power control operative to minimize a radio frequency transmission power of said first energy sensor so that said first energy sensor is out of radio frequency range and unable to directly communicate with said radio frequency repeater while wireless communication with said second energy sensor is maintained; and
  said second energy sensor further operative to receive said communication packet from said first energy sensor and retransmit said communication packet to said radio frequency repeater.

9. The system of claim 8, wherein said radio frequency repeater is operative to retransmit said communication packet to another radio frequency device over said wireless network.

10. The system of claim 8, wherein said communication port is a first communication port, said processor is a first processor, and said second energy sensor comprises:
  at least one measurement coupling device configured to be coupled with said energy distribution system and operative to sense at least one energy parameter in said energy distribution system and generate at least one analog signal indicative thereof;
  at least one analog to digital converter coupled with said at least one measurement coupling device and operative to convert said at least one analog signal to at least one digital signal representative thereof; second processor coupled with said at least one analog to digital converter and operative to generate said at least one energy parameter from said at least one digital signal; and
  a second communication port coupled with said second processor.

11. The system of claim 10, wherein said second energy sensor further comprises an adjustable radio frequency power control coupled with said second communication port and operative to limit an effective radio frequency range of said first communication port.

12. The system of claim 8, wherein said radio frequency repeater further comprises an adjustable radio frequency power control coupled with said communication port and operative to limit an effective radio frequency range of said communication port to enable communication with said second energy sensor but be out of range of communication with said first energy sensor.

13. The system of claim 12, wherein said adjustable radio frequency power control is further coupled with said processor, wherein said processor is further operative to adjust a radio frequency power used by said communication port to enable communication with minimized power usage by said radio frequency repeater.

14. The system of claim 8, wherein said processor is further operative to compute a forward error correcting code for at least a portion of said communication packet; wherein said forward error correcting code is included within said communication packet to enable correction of corrupted information included in said communication packet.

15. The system of claim 14 wherein said radio frequency repeater is further operative to analyze said forward error correcting code from said communication packet and apply at least one bit of correction based on said forward error correcting code to said communication packet before retransmission of said communication packet on said wireless network.

16. A method of measuring the delivery of energy from an energy supplier to a consumer through an energy distribution system, the method comprising:
  measuring at least one first energy parameter with a first energy sensor;
  measuring at least one second energy parameter with a second energy sensor;
  automatically adjusting a radio frequency transmission power of said second energy sensor to provide enough radio frequency transmission power to wirelessly communicate a second communication packet that includes data representative of said second energy parameter from said second energy sensor to a radio frequency repeater;
  automatically adjusting a radio frequency transmission power of said first energy sensor to provide only enough radio frequency transmission power to wirelessly communicate a first communication packet that includes data representative of said first energy parameter from said first energy sensor to said second energy sensor, while keeping said radio frequency repeater outside a communication range of said first energy sensor;

said second energy sensor wirelessly relaying said first communication packet to said radio frequency repeater; and said radio frequency repeater forwarding said first communication packet and said second communication packet for receipt by an energy management system.

17. The method of claim 16, further comprising supplying an electric charge from a solar panel to a power supply included in said radio frequency repeater, storing said electric charge in an energy storage device coupled with said power supply, and supplying power with said power supply to a transceiver, a processor and a data memory included in said radio frequency repeater.

18. The method of claim 17, further comprising indicating to said processor with said power supply when insufficient power is supplied by said power supply, said processor storing in said data memory a communication packet to be transmitted in response to said indication, said processor enabling transmission of said stored communication packet when said power supply ceases said indication.

19. The method of claim 18, wherein said processor storing said communication packet further comprises said processor directing wireless transmission of at least one communication packet that includes indication of insufficient power supplied by said power supply.

20. The method of claim 16, further comprising wirelessly transmitting a communication packet that is destined for said first energy sensor from said radio frequency repeater to said second energy sensor, and said radio frequency repeater wirelessly receiving a communication packet from said second energy sensor that was transmitted from said first energy sensor.

21. The method of claim 16, further comprising said radio frequency repeater wirelessly retransmitting a received communication packet to another radio frequency device.

22. The method of claim 16, wherein automatically adjusting a radio frequency transmission power of said first energy sensor comprises said first energy sensor wirelessly communicating said communication packet that includes said first energy parameter with a first communication port, and said first energy sensor performing wired communication with at least one intelligent electronic device with a second communication port that is in communication with said first communication port.

23. The method of claim 22, further comprising directing transmission and receipt of messages between said first communication port and said second communication port with a processor included in said first energy sensor.

24. The method of claim 16, wherein said first energy sensor, said second energy sensor and said radio frequency repeater are operable to communicate communication packets over a wireless network.

25. The method of claim 16, wherein measuring at least one first energy parameter with a first energy sensor and measuring at least one second energy parameter with a second energy sensor comprises:

sensing at least one energy parameter in said energy distribution system with at least one measurement coupling device that is configured to be coupled with said energy distribution system;

generating with said at least one measurement coupling device at least one analog signal indicative of said at least one energy parameter;

converting said at least one analog signal to at least one digital signal representative thereof with at least one analog to digital converter; and generating said communication packet that includes said first energy parameter or said second energy parameter from said at least one digital signal.

26. The method of claim 16, wherein automatically adjusting a radio frequency transmission power of said second energy sensor comprises adjusting a radio frequency power control included in said second energy sensor to limit an effective radio frequency range of a communication port also included in said second energy sensor.

27. The method of claim 26, wherein adjusting a radio frequency power control further comprises automatically increasing said radio frequency power control with a processor only until said first energy sensor and said radio frequency repeater are in communication range of said second energy sensor.

28. The method of claim 16, further comprising adjusting a radio frequency power control included in said radio frequency repeater to limit an effective radio frequency range of a communication port also included in said radio frequency repeater to communicate with said second energy sensor, but not said first energy sensor.

29. The method of claim 28, wherein adjusting a radio frequency power control further comprises automatically adjusting said radio frequency power control with a processor to minimize power consumption but still enable wireless communication with said second energy sensor.

30. The method of claim 16, further comprising computing a forward error correcting code for a communication packet, wherein said forward error correcting code is included within said communication packet to enable correction of corrupted information also included therein.

31. The method of claim 30, wherein said radio frequency repeater is further operative to analyze said forward error correcting code included in said communication packet and apply at least one bit of correction based on said forward error correcting code to said communication packet before retransmission of said communication packet.

32. The system of claim 1 further comprising a solar panel electrically coupled with said radio frequency repeater to supply electric power to said radio frequency repeater.

33. The system of claim 32 wherein said radio frequency repeater comprises a power supply coupled with a wireless transceiver and said solar panel, and an energy storage device coupled with said power supply, wherein said power supply is operable to store in said energy storage device an electric charge suppliable from said solar panel.

34. The system of claim 32 wherein said radio frequency repeater further comprises a processor coupled with said power supply, and a data memory coupled with said processor, wherein said power supply is configured to indicate to said processor when insufficient power is supplied by said power supply, said processor configured to store said communication packets in said data memory in response to said indication, said processor further configured to enable transmission of said stored communication packets when said power supply ceases said indication.

35. The system of claim 34 wherein said processor is further configured to direct wireless transmission of at least one communication packet that includes indication of insufficient power supplied by said power supply.

36. The system of claim 1 wherein a sleep interval, a transmit interval, and a sample interval of said first and second energy sensors are configurable by a user so that an average power required by said first and second energy sensors is adjustable.

37. The system of claim 1 wherein said adjustable radio frequency transmission power of each of said first and second energy sensors is dynamically adjustable in accordance with an intended destination, or a next intended hop of one of said plurality of communication packets being transmitted.

38. The system of claim 8, wherein said radio frequency repeater comprises a power supply coupled with said communication port and said processor, and a solar panel coupled with said power supply operative to provide power to said radio frequency repeater.

39. The system of claim 38, wherein said power supply further comprises an energy storage device configured to store an electric charge suppliable from, said solar panel.

40. The system of claim 39, wherein said radio frequency repeater is further operative to transmit a communication packet indicative of an insufficient energy supply from said energy storage device and said solar panel.

41. The system of claim 38, wherein said radio frequency repeater further comprises a data memory coupled with said processor wherein said data memory is operative to store at least a portion of said communication packet.

42. The system of claim 41, wherein said radio frequency repeater further comprises a low power flag indicative of an insufficient energy supply to said power supply, wherein said data memory is operative to store said communication packet when energy supplied to said power supply is below an energy threshold and said communication port is operative to transmit said stored communication packet when energy supplied to said power supply is above said energy threshold.

43. The method of claim 16, wherein automatically adjusting a radio frequency transmission power comprises dynamically modifying said radio frequency transmission power in accordance with an intended destination or a next intended hop of a communication packet to be transmitted.

44. The method of claim 16, wherein automatically adjusting a radio frequency transmission power comprises limiting a range of a radio frequency transmission to be within a predetermined radio frequency zone that includes other participating radio frequency devices.

45. the system of claim 1, wherein said first energy sensor and said second energy sensor are configured to independently self adjust said adjustable radio frequency transmission power.

46. The system of claim 1, wherein said first energy sensor is configured to slowly increase a power level of said adjustable radio frequency transmission power only until a message is successfully received by said second energy sensor.

47. The system of claim 8, wherein said first energy sensor is configured to independently self adjust said radio frequency transmission power.

48. The system of claim 8, wherein said first energy sensor is configured to slowly increase a power level or said radio frequency transmission power only until a message is successfully received by said second energy sensor.

49. The method of claim 16, where automatically adjusting a radio frequency transmission power of said first energy sensor comprises said first energy sensor independently self adjusting said radio frequency transmission power, and automatically adjusting a radio frequency transmission power of said second energy sensor comprises said second energy sensor independently self adjusting said radio frequency transmission power.

50. The method of claim 16, where automatically adjusting a radio frequency transmission power of said first energy sensor comprises said first energy sensor slowly increasing a power level of said radio frequency transmission power only until said first communication packet is successfully received by said second energy sensor.

51. The method of claim 50, where automatically adjusting a radio frequency transmission power of said second energy sensor comprises said second energy sensor slowly increasing a power level of said radio frequency transmission power only until said second communication packet is successfully received by said radio frequency repeater.

* * * * *

UNITED STATES PATENT AND TRADEMARK OFFICE
CERTIFICATE OF CORRECTION

PATENT NO. : 7,412,338 B2 Page 1 of 1
APPLICATION NO. : 11/083909
DATED : August 12, 2008
INVENTOR(S) : Arthur B. Wynans et al.

It is certified that error appears in the above-identified patent and that said Letters Patent is hereby corrected as shown below:

Column 23
Line 46, insert a comma -- , -- between "network" and "wherein".

Column 24
Line 15, insert -- a -- between "thereof;" and "second".

Column 27
Line 18, delete the comma "," between "from" and "said".

Column 28
Line 16, delete "or" and insert -- of --.

Signed and Sealed this

Twenty-first Day of October, 2008

JON W. DUDAS
*Director of the United States Patent and Trademark Office*